(12) United States Patent
Moon et al.

(10) Patent No.: US 10,665,655 B2
(45) Date of Patent: May 26, 2020

(54) LIGHT EMITTING DIODE DISPLAY DEVICE

(71) Applicant: Samsung Display Co., Ltd., Yongin-si, Gyeonggi-do (KR)

(72) Inventors: Sung-Jae Moon, Seongnam-si (KR); Dong Gyu Kim, Yongin-si (KR); Sun Park, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/707,637

(22) Filed: Sep. 18, 2017

(65) Prior Publication Data

US 2018/0083085 A1   Mar. 22, 2018

(30) Foreign Application Priority Data

Sep. 20, 2016 (KR) .................. 10-2016-0120119

(51) Int. Cl.
*H01L 27/32* (2006.01)

(52) U.S. Cl.
CPC .......... *H01L 27/3262* (2013.01); *H01L 27/32* (2013.01); *H01L 27/3244* (2013.01); *H01L 27/3246* (2013.01); *H01L 27/3248* (2013.01); *H01L 27/3272* (2013.01); *H01L 27/3276* (2013.01); *H01L 27/3288* (2013.01)

(58) Field of Classification Search
CPC ........................... H01L 27/32; H01L 27/3244
See application file for complete search history.

(56) References Cited

U.S. PATENT DOCUMENTS

| 8,207,531 | B2 | 6/2012 | Takahashi et al. |
| 8,304,710 | B2 | 11/2012 | Takahashi et al. |
| 8,304,981 | B2 | 11/2012 | Kim et al. |
| 8,502,230 | B2 | 8/2013 | Jeong et al. |
| 8,587,006 | B2 | 11/2013 | Kim et al. |
| 2002/0101152 | A1 | 8/2002 | Kimura |
| 2003/0116768 | A1 | 6/2003 | Ishikawa |
| 2005/0168135 | A1 | 8/2005 | Iga |
| 2010/0002173 | A1* | 1/2010 | Otani ................ G02F 1/133555 349/114 |
| 2010/0065952 | A1* | 3/2010 | Oikawa ............... H01L 27/1214 257/679 |

(Continued)

FOREIGN PATENT DOCUMENTS

JP   2003-0084687 A   3/2003

OTHER PUBLICATIONS

European Search Report corresponding to EP Application 17191903, dated Jan. 19, 2018, 8 pages.

*Primary Examiner* — Caridad Everhart
*Assistant Examiner* — Ankus K Singal
(74) *Attorney, Agent, or Firm* — Innovation Counsel LLP

(57) ABSTRACT

The present disclosure relates to a light emitting diode display device, and a light emitting diode display device according to an exemplary embodiment includes: a substrate; a semiconductor disposed on the substrate; a gate electrode disposed on the semiconductor; an interlayer insulating layer disposed on the substrate and the gate electrode; source and drain electrodes disposed on the interlayer insulating layer and connected to the semiconductor; a first slit provided in the interlayer insulating layer; and a first wire disposed on the interlayer insulating layer and configured to overlap the first slit.

35 Claims, 21 Drawing Sheets

(56) References Cited

U.S. PATENT DOCUMENTS

2011/0108841 A1* 5/2011 Hanna ............... H01L 21/02422
  257/59
2012/0168756 A1   7/2012 Ryu et al.
2015/0155169 A1* 6/2015 Oota .................. H01L 21/0262
  438/104
2016/0372662 A1* 12/2016 Takizawa ............ H01L 51/0071

* cited by examiner

LIGHT EMITTING DIODE DISPLAY DEVICE

RELATED APPLICATIONS

This application claims priority to and the benefit of Korean Patent Application No. 10-2016-0120119 filed in the Korean Intellectual Property Office on Sep. 20, 2016, the entire contents of which are incorporated herein by reference.

BACKGROUND

1. Field

The present disclosure relates to a light emitting diode display device.

2. Description of the Related Art

A light emitting diode display device includes two electrodes and an emission layer interposed therebetween. Electrons injected from one electrode and holes injected from the other electrode are combined in the emission layer to generate excitons. When the generated excitons transition to a ground state from an excited state, they release energy in the form of emitted light.

The light emitting diode display device includes a plurality of pixels including a light emitting diode (LED) as a self-emissive element, and a plurality of transistors for driving the light emitting diode (LED) and at least one capacitor are formed in each pixel. The plurality of thin film transistors generally include a switching transistor and a driving transistor.

The thin film transistor includes a gate electrode, a semiconductor, a source electrode, and a drain electrode. The semiconductor may absorb some of the light incident thereon, such that characteristics of the thin film transistor may be changed. For example, when the semiconductor is made of an oxide semiconductor material, visible light in a region of a short wavelength, e.g., shorter than about 387 nm, may be absorbed in the semiconductor, and thus a threshold voltage thereof may decrease.

Although most of the light emitted from the light emitting diode (LED) is directed to an upper surface thereof, some of the emitted light is directed to a lateral surface thereof and, as such, may reach the thin film transistor positioned below the light emitting diode (LED). When this happens, the light incident on the semiconductor of the thin film transistor may cause the reliability of the thin film transistor to deteriorate.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to provide a light emitting diode display device that may improve reliability thereof by blocking light incident on a semiconductor of a thin film transistor.

An exemplary embodiment provides a light emitting diode display device, including: a substrate; a semiconductor disposed on the substrate; a gate electrode disposed on the semiconductor; an interlayer insulating layer disposed on the substrate and the gate electrode; source and drain electrodes disposed on the interlayer insulating layer and connected to the semiconductor; a first slit provided in the interlayer insulating layer; and a first wire positioned on the interlayer insulating layer and configured to overlap the first slit.

The first wire may contact the substrate through the first slit.

The first wire may be disposed at the same layer as the source electrode and the drain electrode, and may be made of the same material as that of the source electrode and the drain electrode.

The first wire may be a common voltage line.

The first wire may be a driving voltage line connected to the source electrode.

The first wire may be disposed at the same layer as the source electrode and the drain electrode, and may be made of the same material as that of the source electrode and the drain electrode.

The first wire may be a common voltage line.

The first wire may be connected to the source electrode.

The first slit may be adjacent to an edge of one side of the semiconductor, and may not overlap the semiconductor.

The first slit may have a bar shape extending in a first direction.

The first slit may extend in a direction parallel to the first wire.

The first slit may have a bar shape extending in a direction parallel to the first wire.

The drain electrode may have an island shape.

The semiconductor may include a channel region and a contact doping region positioned at opposite sides of the channel region, and the channel region may be covered by the drain electrode.

The light emitting diode display device may further include a second slit provided in the interlayer insulating layer, wherein the drain electrode overlaps the second slit.

The drain electrode may contact the substrate through the second slit.

The second slit may be adjacent to an edge of one side of the semiconductor, and may not overlap the semiconductor.

The second slit may extend in a direction crossing a direction in which the first wire extends.

The light emitting diode display device may further include a first electrode connected to the drain electrode, and a passivation layer disposed between the drain electrode and the first electrode, wherein the passivation layer may be made of a light blocking material.

The light emitting diode display device may further include a pixel defining layer configured to overlap an edge of the first electrode, wherein the pixel defining layer may be made of a light blocking material.

The light emitting diode display device may further include a first electrode connected to the drain electrode, and a pixel defining layer configured to overlap an edge of the first electrode, wherein the pixel defining layer may be made of a light blocking material.

The light emitting diode display device may further include a buffer layer disposed between the substrate and the interlayer insulating layer, wherein the first slit may be provided in the buffer layer and the interlayer insulating layer.

The light emitting diode display device may further include a buffer layer disposed between the substrate and the interlayer insulating layer, wherein the first wire may contact the buffer layer through the first slit.

The light emitting diode display device may further include a third slit provided in the interlayer insulating layer, and a second wire positioned on the interlayer insulating layer and configured to overlap the third slit.

The second wire may be connected to the substrate through the third slit.

The light emitting diode display device may further include a buffer layer disposed between the substrate and the interlayer insulating layer, wherein the second wire may contact the buffer layer through the third slit.

The light emitting diode display device may further include a gate insulating layer disposed between the substrate and the gate electrode, and a fourth slit provided in the gate insulating layer, wherein the gate electrode may overlap the fourth slit.

The gate electrode may be connected to the substrate through the fourth slit.

The light emitting diode display device may further include a buffer layer disposed between the substrate and the gate insulating layer, wherein the gate electrode may contact the buffer layer through the fourth slit.

The light emitting diode display device may further include a first electrode connected to the drain electrode, wherein the first electrode may cover most of the semiconductor.

The first electrode may cover all of the semiconductor, the source electrode, the drain electrode, the gate electrode, and the first wire.

Another embodiment provides a light emitting diode display device, including: a substrate; a semiconductor disposed on the substrate; source and drain electrodes connected to the semiconductor; a gate electrode disposed on the semiconductor; a gate insulating layer disposed between the substrate and the gate electrode; and a first slit provided in the gate insulating layer, and configured to overlap the gate electrode.

The gate electrode may contact the substrate through the first slit.

The first slit may be adjacent to an edge of one side of the semiconductor, and may not overlap the semiconductor.

The first slit may have a bar shape extending in a first direction.

The light emitting diode display device may further include an interlayer insulating layer disposed between the substrate and the drain electrode, and a second slit provided in the interlayer insulating layer, wherein the drain electrode may overlap the second slit.

The drain electrode may contact the substrate through the second slit.

The second slit may be adjacent to an edge of one side of the semiconductor, and may not overlap the semiconductor.

The second slit may have a bar shape extending in a direction crossing the direction in which the first slit extends.

The light emitting diode display device may further include a buffer layer disposed between the substrate and the gate insulating layer, wherein the gate electrode contacts the buffer layer through the first slit.

According to the embodiment, it is possible to improve reliability of a light emitting diode display device by blocking light incident on a semiconductor of a thin film transistor.

DETAILED DESCRIPTION

Figure 1:
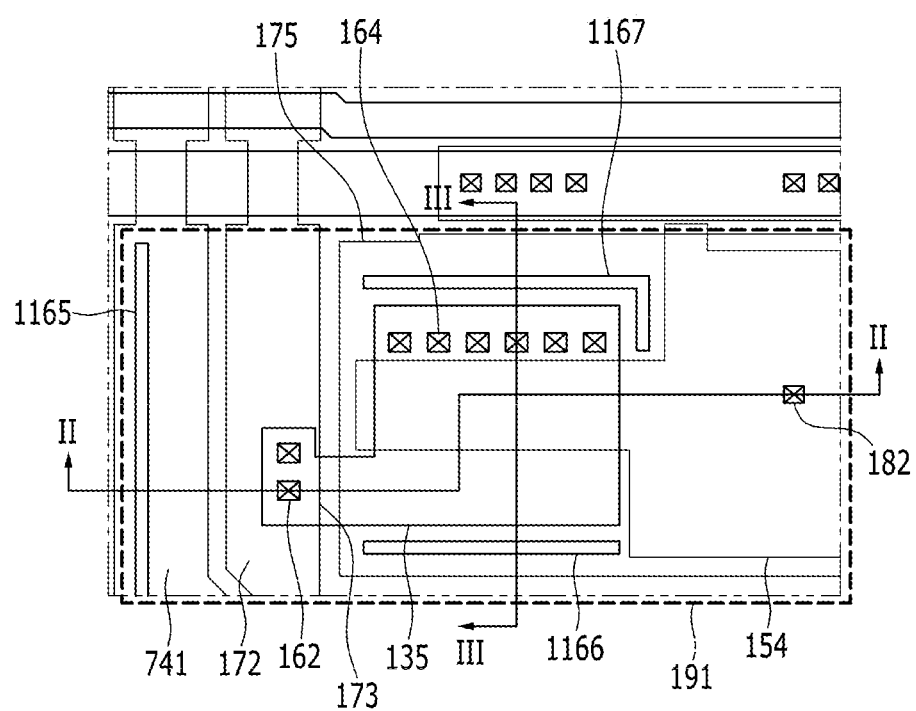
FIG. 1 illustrates a layout view of a light emitting diode display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clearly describe the present invention, portions which do not relate to the description are omitted, and like reference numerals designate like elements throughout the specification.

Further, the size and thickness of each component shown in the drawings are arbitrarily shown for better understanding and ease of description, but the present invention is not limited thereto. In the drawings, the thickness of layers, films, panels, regions, etc., are exaggerated for clarity. For better understanding and ease of description, the thickness of some layers and areas is exaggerated.

It will be understood that when an element such as a layer, film, region, or substrate is referred to as being "on" another element, it may be directly on the other element, or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Throughout the specification, the phrase "on a plane" means viewing the object portion from the top, and the phrase "on a cross-section" means viewing a cross-section of which the object portion is vertically cut from the side.

A light emitting diode display device according to an exemplary embodiment will be described with reference to FIG. 1 to FIG. 3.

Figure 2:
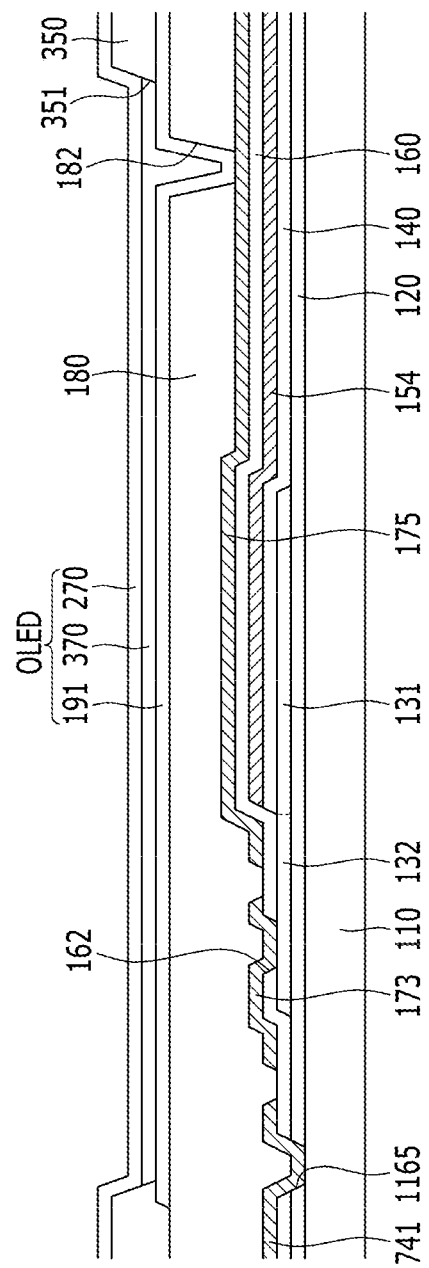
FIG. 2 illustrates a cross-sectional view taken along line II-II of FIG. 1.
Figure 3:
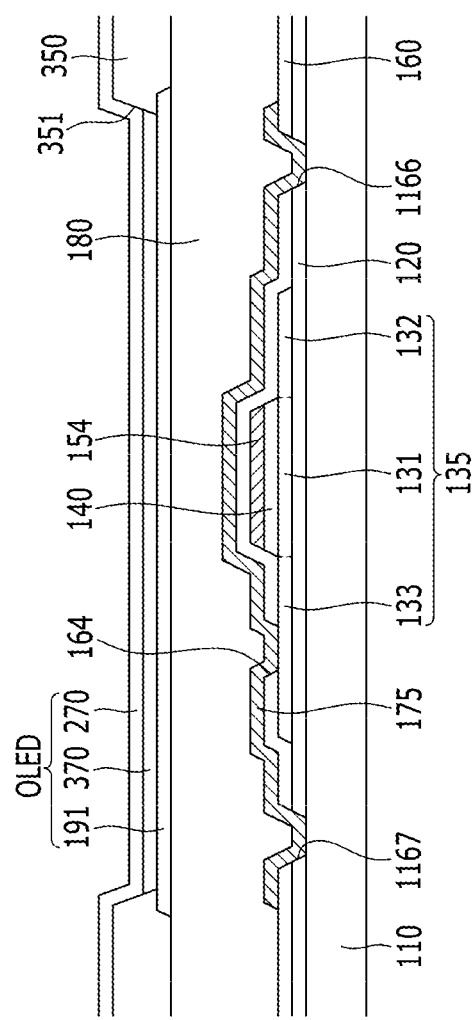
FIG. 3 illustrates a cross-sectional view taken along line of FIG. 1.

FIG. 1 illustrates a layout view of a light emitting diode display device according to an exemplary embodiment, FIG. 2 illustrates a cross-sectional view taken along line II-II of FIG. 1, and FIG. 3 illustrates a cross-sectional view taken along line of FIG. 1.

As shown in FIG. 1 to FIG. 3, in the light emitting diode display device according to the exemplary embodiment, a buffer layer 120 is positioned on a substrate 110.

The substrate 110 may be an insulating substrate made of glass, quartz, ceramic, plastic, etc., or a metal substrate made of stainless steel and the like.

The buffer layer 120 may include an inorganic or organic insulating material such as a silicon oxide (SiOx), a silicon nitride (SiNx), silicon oxynitride (SiON), silicon oxyfluoride (SiOF), an aluminum oxide (AlOx), etc., and it may be formed as a single layer or a multilayer including at least one of the materials. The buffer layer 120 serves to flatten a surface while preventing undesirable materials, such as impurities or moisture, from permeating. The buffer layer 120 may be positioned on most of a region of the substrate 110. The buffer layer 120 may be omitted in some cases.

A semiconductor 135 is positioned on the buffer layer 120. The semiconductor 135 may be made of a polycrystalline semiconductor material or an oxide semiconductor material. In addition, the semiconductor 135 includes a channel region 131, and contact doping regions 132 and 133 that are positioned at opposite sides of the channel region 131 and include impurities such as P-type impurities or N-type impurities. The contact doping regions 132 and 133 include a source region 132 and a drain region 133. In this case, the doped impurities may vary depending on a kind of the thin film transistor.

A gate insulating layer 140 is positioned on the semiconductor 135 and the buffer layer 120. The gate insulating layer 140 may include an inorganic insulating material or an organic insulating material such as a silicon oxide (SiOx), a silicon nitride (SiNx), silicon oxynitride (SiON), silicon oxyfluoride (SiOF), an aluminum oxide (AlOx), etc., and it may be formed as a single layer or a multilayer including at least one of the materials.

A gate electrode 154 is positioned on the gate insulating layer 140. The gate electrode 154 overlaps at least some of the semiconductor 135, and particularly, the channel region 131.

An interlayer insulating layer 160 is positioned on the gate electrode 154, the semiconductor 135, and the buffer layer 120. The interlayer insulating layer 160 may include an inorganic insulating material or organic insulating material such as a silicon oxide (SiOx), a silicon nitride (SiNx), silicon oxynitride (SiON), silicon oxyfluoride (SiOF), an aluminum oxide (AlOx), etc., and it may be formed as a single layer or a multilayer including at least one of the materials.

Contact holes 162 and 164 overlapping at least some of the semiconductor 135 are provided in the interlayer insulating layer 160. The contact holes 162 and 164 expose the contact doping regions 132 and 133 of the semiconductor 135.

A source electrode 173 and a drain electrode 175 are positioned on the interlayer insulating layer 160. The source electrode 173 is connected to the source region 132 of the semiconductor 135 through the contact hole 162. The drain electrode 175 is connected to the drain region 133 of the semiconductor 135 through the contact hole 164. The drain electrode 175 may be formed to have an island shape.

The semiconductor 135 overlaps the source electrode 173 and the drain electrode 175. In this case, most of the channel region 131 of the semiconductor 135 may overlap the drain electrode 175. In FIG. 1, the channel region 131 of the semiconductor 135 is entirely covered by the drain electrode 175.

A driving voltage line 172 and a common voltage line 741 are further positioned on the interlayer insulating layer 160. The driving voltage line 172 and the common voltage line 741 may extend in a direction parallel to each other, and they are adjacent to each other. A driving voltage (ELVDD) is applied to the driving voltage line 172. The driving voltage line 172 is connected to the source electrode 173 to transmit the driving voltage (ELVDD) to the source electrode 173. A common voltage (ELVSS) is applied to the common voltage line 741.

Slits 1165, 1166, and 1167 are further formed in the buffer layer 120 and the interlayer insulating layer 160, and the slits 1165, 1166, and 1167 do not overlap the semiconductor 135 and the gate electrode 154. The slits 1165, 1166, and 1167 expose the substrate 110.

The slit 1165 overlaps the common voltage line 741. The common voltage line 741 contacts the substrate 110 through the slit 1165. The slit 1165 may have a bar shape in a plan view, and may extend in a direction substantially parallel to the common voltage line 741. For example, the slit 1165 may substantially extend in a vertical direction. The slit 1165 is positioned at a left side of the semiconductor 135 in a plan view, and it may be positioned to be adjacent to a left edge of the semiconductor 135. The common voltage line 741 is positioned in the slit 1165, and the common voltage line 741 may be made of an opaque metal material. Accordingly, light otherwise would be incident on left and right sides of the semiconductor 135 may be blocked by the common voltage line 741 positioned in the slit 1165.

The slits 1166 and 1167 overlap the drain electrode 175. The drain electrode 175 contacts the substrate 110 through the slits 1166 and 1167. The slits 1166 and 1167 may have bar shapes in a plan view, and they may extend in a direction substantially perpendicular to the common voltage line 741. For example, the slits 1166 and 1167 may substantially extend in a horizontal direction. The slit 1166 may be positioned below the semiconductor 135 in a plan view, and it may be positioned to be adjacent to a lower edge of the semiconductor 135. The slit 1167 may be positioned above the semiconductor 135 in a plan view, and it may be formed to have a bar shape that is bent once (e.g., an L shape). In this case, most of the slit 1167 is positioned at an upper side of the semiconductor 135, some of a remaining part thereof is positioned at a right side of the semiconductor 135, and the slit 1167 may be positioned to be adjacent to upper and right edges of the semiconductor 135. The drain electrode 175 is positioned in the slits 1166 and 1167, and the drain electrode 175 may be made of an opaque metal material. Accordingly, light otherwise would be incident on upper and lower surfaces of the semiconductor 135 may be blocked by the drain electrode 175 positioned in the slits 1166 and 1167.

As such, the light incident on a lateral surface of the semiconductor 135 may be blocked by the common voltage line 741 and the drain electrode 175 positioned in the slits 1165, 1166, and 1167 and made of an opaque metal material. Further, an upper surface of the semiconductor 135 is mostly covered by the source electrode 173 and the drain electrode 175, and thus light otherwise would be incident on the upper surface of the semiconductor 135 may also be blocked. In the present exemplary embodiment, light incident on the upper and lateral surfaces of the semiconductor 135 may be blocked by using the common voltage line 741, the drain electrode 175, etc., and a separate light blocking material layer is not required.

Since a predetermined voltage is applied to the common voltage line 741 and the drain electrode 175, when different metal layers are exposed through the slits 1165, 1166, and 1167, they may be short-circuited with the common voltage line 741 or the drain electrode 175. Accordingly, in some embodiments, the different metal layers may not be positioned below the slits 1165, 1166, and 1167. That is, the common voltage line 741 and the drain electrode 175 may be disposed to contact the substrate 110, the buffer layer 120, the interlayer insulating layer 160, etc., through the slits 1165, 1166, and 1167 and to not contact the gate electrode 154, etc.

The semiconductor 135, the gate electrode 154, the source electrode 173, and the drain electrode 175 form one thin film transistor. A structure of the thin film transistor is not limited to the aforementioned example, and may be modified to a variety of disclosed structures that can be easily implemented by those skilled in the art.

A passivation layer 180 is positioned on the source electrode 173, the drain electrode 175, the common voltage line 741, the driving voltage line 172, and the interlayer insulating layer 160. The passivation layer 180 serves to remove and flatten steps, thereby increasing luminous efficiency of the OLED to be formed thereon. A contact hole 182 overlapping at least some of the drain electrode 175 is formed in the passivation layer 180.

The passivation layer 180 may be made of a polyacrylate resin, an epoxy resin, a phenolic resin, a polyamide resin, a polyimide resin, an unsaturated polyester resin, a polyphenylene resin, a polyphenylene sulfide resin, and benzocyclobutene (BCB).

A first electrode 191 is positioned on the passivation layer 180. The first electrode 191 may be made of a transparent conductive material such as indium tin oxide (ITO), indium zinc oxide (IZO), zinc oxide (ZnO), indium oxide (In$_2$O$_3$), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The first electrode 191 is electrically connected to the drain electrode 175 of the thin film transistor via the contact hole 182 formed in the passivation layer 180, and becomes the anode of the OLED.

Although not illustrated, the first electrode 191 may include first and second transparent electrodes including a transparent conductive material, and a semi-transmissive layer positioned between the first and second transparent electrodes to form a microcavity together with the second electrode 270. That is, the first electrode 191 may be formed as a multilayer including a layer made of the transparent conductive material and a layer made of a reflective metal material.

A pixel defining layer 350 is positioned on the passivation layer 180 and on an edge portion of the first electrode 191. The pixel defining layer 350 includes a pixel opening 351 that does not cover the first electrode 191. The pixel defining layer 350 surrounds edges of the first electrode 191. The pixel defining layer 350 may include a resin such as a polyacrylate resin and a polyimide resin, or a silica-based inorganic material.

An organic emission layer 370 is provided in the pixel opening 351 of the pixel defining layer 350. The organic emission layer 370 is formed as a multilayer including one or more of an emission layer, a hole-injection layer (HIL), a hole-transporting layer (HTL), an electron-transporting layer (ETL), and an electron-injection layer (EIL). In a case in which the organic emission layer 370 includes all the layers, the hole-injection layer may be positioned on the first electrode 191 corresponding to an anode, and then the hole-transporting layer, the emission layer, the electron-transporting layer, and the electron-injection layer may be sequentially stacked thereon.

The organic emission layer 370 may include a red organic emission layer for emitting red light, a green organic emission layer for emitting green light, and a blue organic emission layer for emitting blue light. The red organic emission layer, the green organic emission layer, and the blue organic emission layer are respectively formed on red, green, and blue pixels to implement a color image.

Alternatively, in the organic light emission layer 370, a color image may be implemented by respectively stacking the red, green, and blue organic light emission layers on the red pixel, the green pixel, and the blue pixel, and then forming red, green, and blue color filters for each pixel. As another example, a color image may be implemented by forming a white organic emission layer emitting white light on all of the red, green, and blue pixels and respectively forming red, green, and blue color filters for each pixel. When the color image is implemented by using the white organic emission layer and the color filter, a deposition mask for depositing the red, green, and blue organic emission layers on each pixel, that is, the red, green, and blue pixels, is not required.

The white organic emission layer described in another exemplary embodiment may be formed as a single organic emission layer, and may further include a structure for emitting white light by laminating a plurality of organic emission layers. For example, a structure for emitting white light by combining at least one yellow organic emission layer with at least one blue organic emission layer, a structure for emitting white light by combining at least one cyan organic emission layer with at least one red organic emission layer, and a structure for emitting white light by combining at least one magenta organic emission layer with at least one green organic emission layer may be included.

A second electrode 270 is positioned on the pixel defining layer 350 and the organic emission layer 370. The second electrode 270 is connected to the common voltage line 741 to receive a common voltage. The second electrode 270 may be made of a transparent conductive material such as indium tin oxide (ITO), indium zinc oxide (IZO), zinc oxide (ZnO), indium oxide (In$_2$O$_3$), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The second electrode 270 becomes the cathode of the organic light emitting diode (OLED). The first electrode 191, the organic emission layer 370, and the second electrode 270 form the organic light emitting diode (OLED).

The organic emission layer 370 may be substituted with an emission layer made of an inorganic material. In this case, another light-emitting device may be used instead of the organic light emitting diode (OLED). For example, a quantum light emitting diode (QLED) and the like may be used.

Although most of the light generated from the organic light emitting diode (OLED) is emitted from an upper surface thereof, some of the light is emitted from a lateral surface thereof. The light emitted from the lateral surface of the organic light emitting diode (OLED) may be directed toward a thin film transistor of an adjacent pixel. In the present exemplary embodiment, the slits 1165, 1166, and 1167 are positioned to surround the lateral surface of the semiconductor 135, and the common voltage line 741 and the drain electrode 175 are positioned to overlap the slits 1165, 1166, and 1167, thereby preventing the light directed toward the thin film transistor from reaching the semiconductor 135. Accordingly, it is possible to prevent characteristics of the semiconductor 135 from being changed and to improve reliability of the thin film transistor.

In the present exemplary embodiment, the passivation layer and the pixel defining layer may be made of a transparent material. However, the present invention is not limited thereto, and in a light emitting diode display device according to another exemplary embodiment, the passivation layer or the pixel defining layer may be made of a light blocking material. A passivation layer and/or a pixel defining layer made of a light blocking material will be described with reference to FIG. 4.

Figure 4:
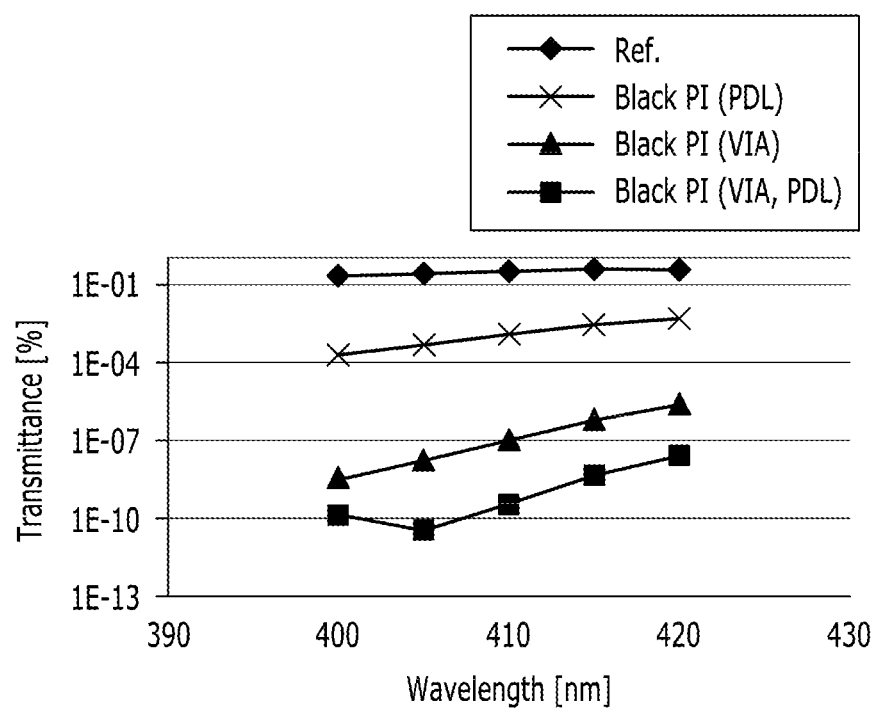
FIG. 4 illustrates a transmittance graph according to materials of a passivation layer and a pixel defining layer.

FIG. 4 illustrates a transmittance graph according to materials of a passivation layer and a pixel defining layer.

As shown in FIG. 4, in a case (hereinafter referred to as a 'reference') (Ref) in which both the passivation layer and the pixel defining layer are made of the transparent material, transmittance thereof is highest. That is, in the reference (Ref.), an amount of light that passes through the passivation layer and the pixel defining layer and then reaches the thin film transistor may be a maximum.

In a case (hereinafter referred to as an 'A case') (Black PI (PDL)) in which the passivation layer is made of a transparent material and the pixel defining layer is made of an opaque material, transmittance thereof is lower than the reference (Ref). That is, in the A case (Black PI (PDL)), an amount of light that passes through the passivation layer and the pixel defining layer and then reaches the thin film transistor may be smaller than that of the reference (Ref).

In a case (hereinafter, referred to as a 'B case') (Black PI (VIA)) in which the passivation layer is made of an opaque material and the pixel defining layer is made of a transparent material, transmittance thereof is lower than the reference (Ref) and the A case (Black PI (PDL)). That is, in the B case (Black PI (VIA)), an amount of light that passes through the passivation layer and the pixel defining layer and then reaches the thin film transistor may be smaller than that of the reference (Ref) and the A case (Black PI (PDL)).

In a case (hereinafter referred to as a 'C case') (Black PI (VIA, PDL)) in which both the passivation layer and the pixel defining layer are made of an opaque material, transmittance thereof is lowest. That is, in the C case (Black PI (VIA, PDL)), an amount of light that passes through the passivation layer and the pixel defining layer and then reaches the thin film transistor may be a minimum.

As described above, by making the passivation layer and/or the pixel defining layer of the light blocking material, it is possible to decrease an amount of light incident on the thin film transistor to prevent characteristics of the semiconductor from being changed, thereby improving reliability of the thin film transistor.

Hereinafter, a light emitting diode display device according to an exemplary embodiment will be described with reference to FIG. 5 and FIG. 6.

Figure 5:
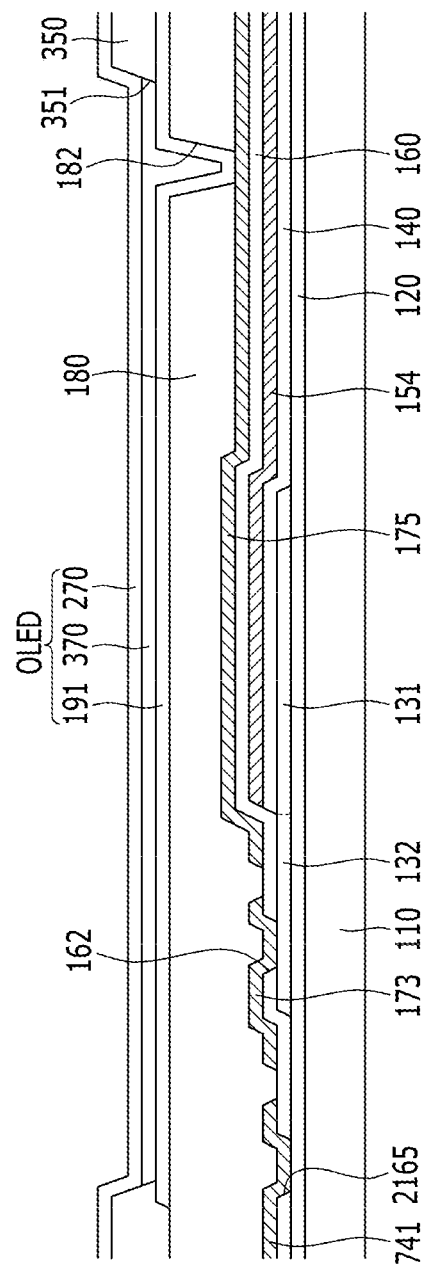
FIG. 5 and FIG. 6 illustrate cross-sectional views of a light emitting diode display device according to an exemplary embodiment.
Figure 6:
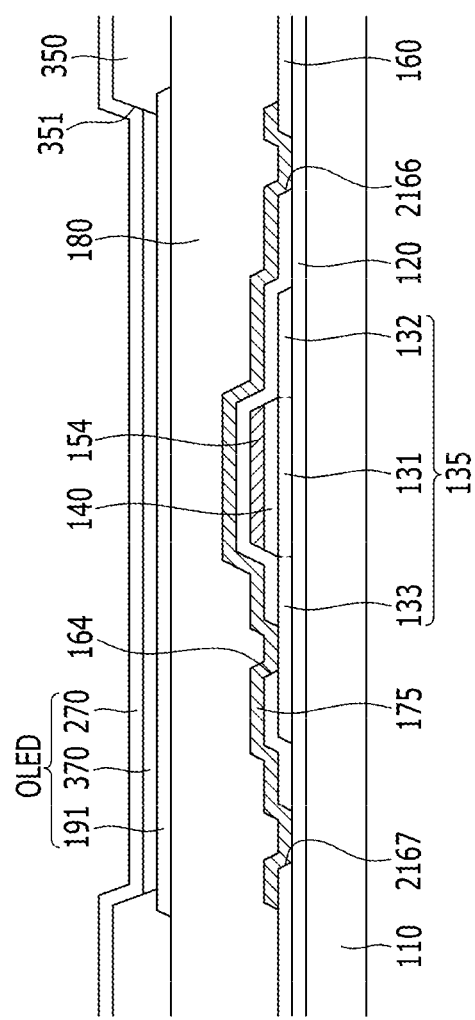

The light emitting diode display device according to the exemplary embodiment shown in FIG. 5 and FIG. 6 includes many portions that are the same as those in the light emitting diode display device according to the exemplary embodiment shown in FIG. 1 to FIG. 3, which will not be described. In the present exemplary embodiment, a configuration in which the common voltage line and the drain electrode do not contact the substrate is different from that of the previous exemplary embodiments, and will now be described in detail.

FIG. 5 and FIG. 6 illustrate cross-sectional views of a light emitting diode display device according to an exemplary embodiment.

As shown in FIG. 5 and FIG. 6, a light emitting diode display device according to an exemplary embodiment includes the substrate 110, the semiconductor 135 positioned on the substrate 110, the gate electrode 154 positioned on the semiconductor 135, the interlayer insulating layer 160 positioned on the substrate 110 and the gate electrode 154, and the source electrode 173 and the drain electrode 175 positioned on the interlayer insulating layer 160.

Slits 2165, 2166, and 2167 are provided in the interlayer insulating layer 160, and the slits 2165, 2166, and 2167 do not contact the semiconductor 135 and the gate electrode 154. The buffer layer 120 is further positioned between the substrate 110 and the semiconductor 135, and the slits 2165, 2166, and 2167 expose the buffer layer 120. Although the slits are provided in the buffer layer in the previous exemplary embodiment, the slits are not provided in the buffer layer in the present exemplary embodiment.

The slit 2165 overlaps the common voltage line 741. The common voltage line 741 may contact the buffer layer 120 through the slit 2165, while it may not contact the substrate 110. The slit 2165 may have a bar shape in a plan view, and may extend in the direction substantially parallel to the common voltage line 741. For example, the slit 2165 may substantially extend in a vertical direction. The slit 2165 is positioned at the left side of the semiconductor 135 in a plan view, and it may be positioned to be adjacent to the left edge of the semiconductor 135. The common voltage line 741 is positioned in the slit 2165, and the common voltage line 741 may be made of an opaque metal material. Accordingly, light otherwise would be incident on a left surface of the semiconductor 135 may be blocked by the common voltage line 741 positioned in the slit 2165.

The slits 2166 and 2167 overlap the drain electrode 175. The drain electrode 175 may contact the buffer layer 120 through the slits 2166 and 2167, while it may not contact the substrate 110. The slits 2166 and 2167 may have bar shapes in a plan view, and they may extend in a direction substantially perpendicular to the common voltage line 741. For example, the slits 2166 and 2167 may substantially extend in a horizontal direction. The slit 2166 may be positioned below the semiconductor 135 in a plan view, and it may be positioned to be adjacent to the lower edge of the semiconductor 135. The slit 2167 may be positioned above the semiconductor 135 in a plan view, and it may be formed to have a bar shape that is bent once. In this case, most of the slit 2167 is positioned at the upper side of the semiconductor 135, some of a remaining part thereof is positioned at the right side of the semiconductor 135, and the slit 2167 may be positioned to be adjacent to the upper and right edges of the semiconductor 135. The drain electrode 175 is positioned in the slits 2166 and 2167, and the drain electrode 175 may be made of an opaque metal material. Accordingly, light otherwise would be incident on upper and lower surfaces of the semiconductor 135 may be blocked by the drain electrode 175 positioned in the slits 2166 and 2167.

As such, the light incident on the lateral surface of the semiconductor 135 may be blocked by the common voltage line 741 and the drain electrode 175 positioned in the slits 2165, 2166, and 2167 and made of an opaque metal material.

Since a predetermined voltage is applied to the common voltage line 741 and the drain electrode 175, when different metal layers are exposed through the slits 2165, 2166, and 2167, they may be short-circuited with the common voltage line 741 and the drain electrode 175. Accordingly, it is preferable that the different metal layers are not positioned below the slits 2165, 2166, and 2167.

Hereinafter, a light emitting diode display device according to an exemplary embodiment will be described with reference to FIG. 7 and FIG. 8.

Figure 7:
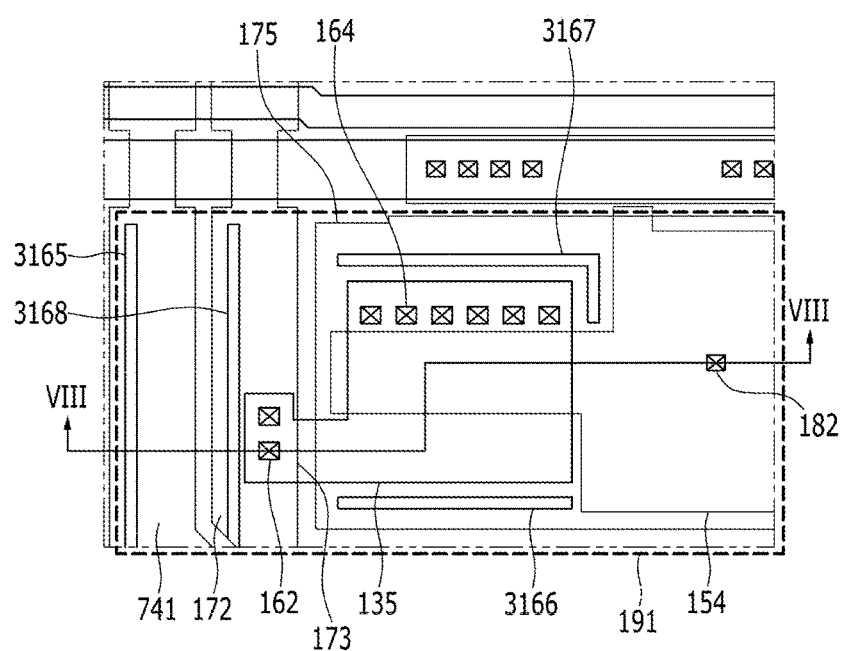
FIG. 7 illustrates a layout view of a light emitting diode display device according to an exemplary embodiment.
Figure 8:
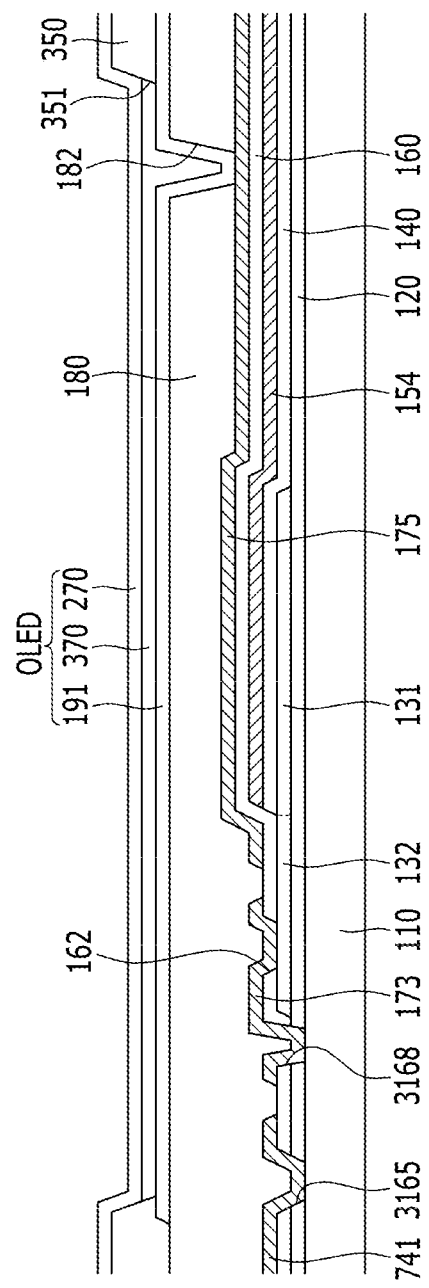
FIG. 8 illustrates a cross-sectional view taken along line VIII-VIII of FIG. 7.

The light emitting diode display device according to the exemplary embodiment shown in FIG. 7 and FIG. 8 includes many portions that are the same as those in the light emitting diode display device according to the exemplary embodiment shown in FIG. 1 to FIG. 3, which will not be described. In the present exemplary embodiment, a configuration in which the driving voltage line and the source electrode contact the substrate is different from that of the previous exemplary embodiments, and will now be described in detail.

FIG. 7 illustrates a layout view of a light emitting diode display device according to an exemplary embodiment, and FIG. 8 illustrates a cross-sectional view taken along line of FIG. 1.

As shown in FIG. 7 and FIG. 8, a light emitting diode display device according to an exemplary embodiment includes the substrate 110, the semiconductor 135 positioned on the substrate 110, the gate electrode 154 positioned on the semiconductor 135, the interlayer insulating layer 160 positioned on the substrate 110 and the gate electrode 154, and the source electrode 173 and the drain electrode 175 positioned on the interlayer insulating layer 160.

Slits 3165, 3166, 3167, and 3168 are provided in the interlayer insulating layer 160, and the slits 3165, 3166, 3167, and 3168 do not contact the semiconductor 135 and the gate electrode 154. The slits 3165, 3166, 3167, and 3168 expose the substrate 110.

The slit 3165 overlaps the common voltage line 741. The common voltage line 741 contacts the substrate 110 through the slit 3165.

The slits 3166 and 3167 overlap the drain electrode 175. The drain electrode 175 contacts the substrate 110 through the slits 3166 and 3167.

The slit 3168 overlaps the driving voltage line 172 and the source electrode 173. The driving voltage line 172 and the source electrode 173 contact the substrate 110 through the slit 3168. The slit 3168 may have a bar shape in a plan view, and may extend in a direction substantially parallel to the driving voltage line 172. For example, the slit 3168 may substantially extend in a vertical direction. The slit 3168 is positioned at the left side of the semiconductor 135 in a plan view, and it may be positioned to be adjacent to the left edge of the semiconductor 135. The driving voltage line 172 is positioned in the slit 3168, and the driving voltage line 172 may be made of an opaque metal material. Accordingly, light otherwise would be incident on the left surface of the semiconductor 135 may be blocked by the driving voltage line 172 positioned in the slit 3168.

As such, the light incident on the lateral surface of the semiconductor 135 may be blocked by the common voltage line 741, the drain electrode 175, and the driving voltage line 172 positioned in the slits 3165, 3166, 3167, and 3168 and made of an opaque metal material. Further, the upper surface of the semiconductor 135 is mostly covered by the source electrode 173 and the drain electrode 175, and thus light otherwise would be incident on the upper surface of the semiconductor 135 may also be blocked. In the present exemplary embodiment, without adding a separate light blocking material layer, the light incident on the upper and lateral surfaces of the semiconductor 135 may be blocked by using the common voltage line 741, the drain electrode 175, the driving voltage line 172, the source electrode 173, etc.

Since a predetermined voltage is applied to the common voltage line 741, the drain electrode 175, the driving voltage line 172, and the source electrode 173, when different metal layers are exposed through the slits 3165, 3166, 3167, and 3168, they may be short-circuited with the common voltage line 741, the drain electrode 175, the driving voltage line 172, and the source electrode 173. Accordingly, in some embodiments, the different metal layers are not positioned below the slits 3165, 3166, 3167, and 3168.

Hereinafter, a light emitting diode display device according to an exemplary embodiment will be described with reference to FIG. 9.

Figure 9:
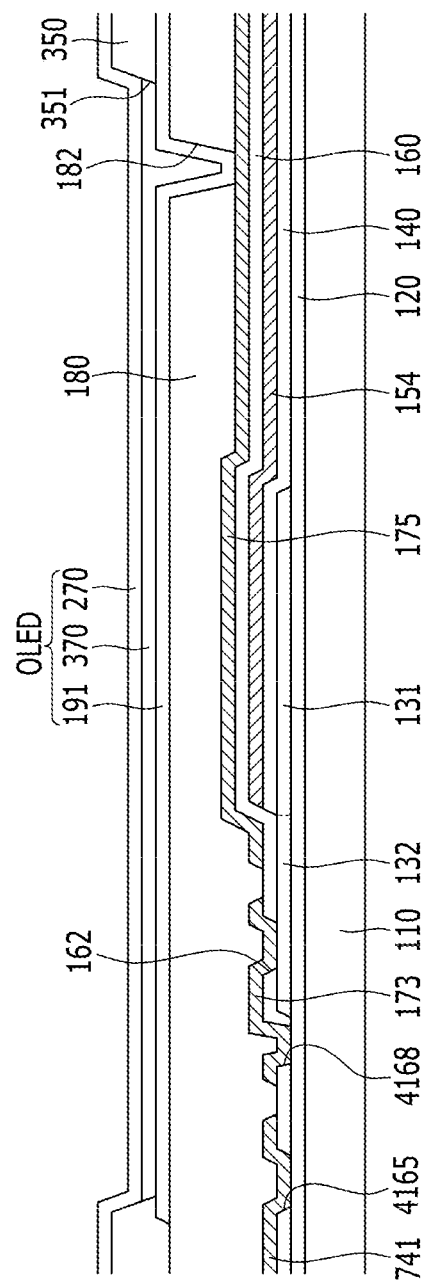
FIG. 9 illustrates a cross-sectional view of a light emitting diode display device according to an exemplary embodiment.

The light emitting diode display device according to the exemplary embodiment shown in FIG. 9 includes many portions that are the same as those in the light emitting diode display device according to the exemplary embodiment shown in FIG. 7 and FIG. 8, which will not be described. In the present exemplary embodiment, a configuration in which the common voltage line, the drain electrode, the driving voltage line, and the source electrode do not contact the substrate is different from that of the previous exemplary embodiments, and will now be described in detail.

FIG. 9 illustrates a cross-sectional view of a light emitting diode display device according to an exemplary embodiment.

As shown in FIG. 9, a light emitting diode display device according to an exemplary embodiment includes the substrate 110, the semiconductor 135 positioned on the substrate 110, the gate electrode 154 positioned on the semiconductor 135, the interlayer insulating layer 160 positioned on the substrate 110 and the gate electrode 154, and the source electrode 173 and the drain electrode 175 positioned on the interlayer insulating layer 160.

Slits 4165 and 4168 are provided in the interlayer insulating layer 160, and the slits 4165 and 4168 do not overlap the semiconductor 135 and the gate electrode 154. The buffer layer 120 is further positioned between the substrate 110 and the semiconductor 135, and the slits 4165 and 4168 expose the buffer layer 120. Although the slit is provided in the buffer layer in the previous exemplary embodiment, the slit is not provided in the buffer layer in the present exemplary embodiment.

The slit 4165 overlaps the common voltage line 741. The common voltage line 741 may contact the buffer layer 120 through the slit 4165, while it may not contact the substrate 110.

The slit 4168 overlaps the driving voltage line 172 and the source electrode 173. The driving voltage line 172 and the source electrode 173 may contact the buffer layer 120 through the slit 4168, while it may not contact the substrate 110.

Similarly, although not illustrated, the drain electrode 175 may also contact the buffer layer 120 through the slit, while it may not contact the substrate 110.

Hereinafter, a light emitting diode display device according to an exemplary embodiment will be described with reference to FIG. 10 and FIG. 11.

Figure 10:
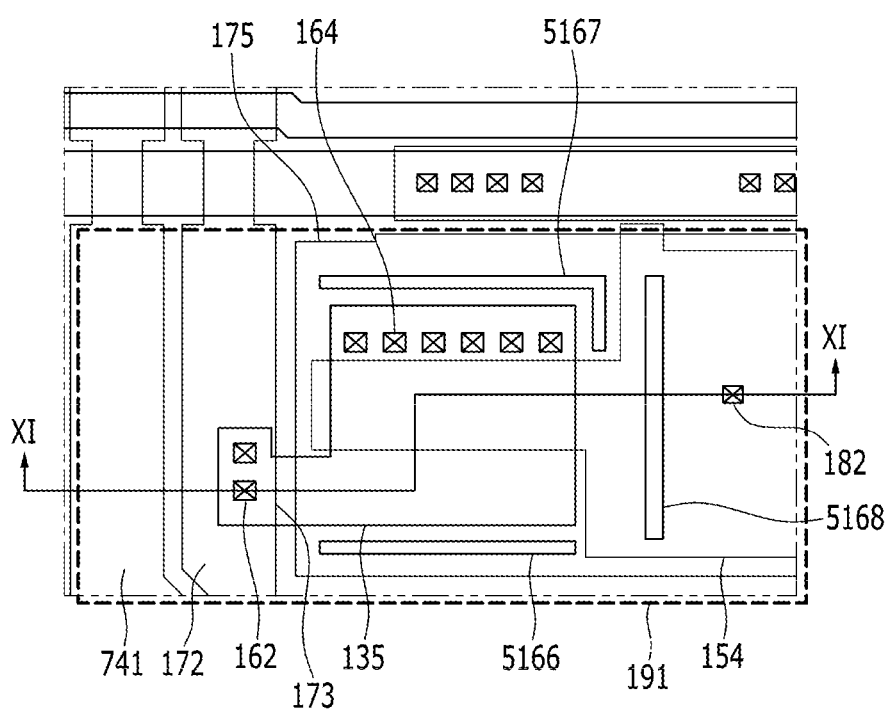
FIG. 10 illustrates a layout view of a light emitting diode display device according to an exemplary embodiment.
Figure 11:
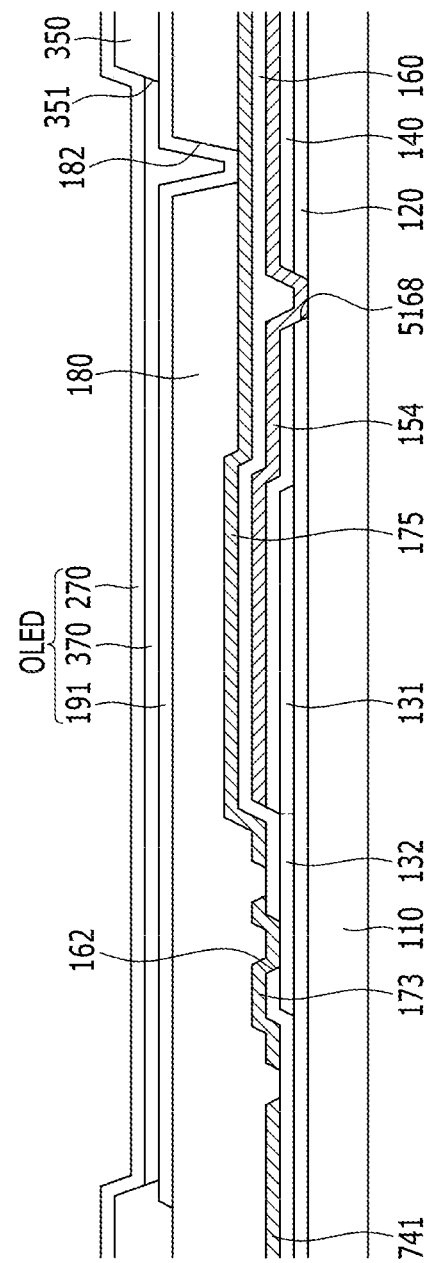
FIG. 11 illustrates a cross-sectional view taken along line XI-XI of FIG. 10.

The light emitting diode display device according to the exemplary embodiment shown in FIG. 10 and FIG. 11 includes many portions that are the same as those in the light emitting diode display device according to the exemplary embodiment shown in FIG. 1 to FIG. 3, which will not be described. In the present exemplary embodiment, a configuration in which the gate electrode contacts the substrate is different from that of the previous exemplary embodiments, and will now be described in detail.

FIG. 10 illustrates a layout view of a light emitting diode display device according to an exemplary embodiment, and FIG. 11 illustrates a cross-sectional view taken along line XI-XI of FIG. 10.

As shown in FIG. 10 and FIG. 11, a light emitting diode display device according to an exemplary embodiment includes the substrate 110, the semiconductor 135 positioned on the substrate 110, the gate insulating layer 140 positioned on the semiconductor 135, the gate electrode 154 positioned on the gate insulating layer 140, the interlayer insulating layer 160 positioned on the substrate 110 and the gate electrode 154, and the source electrode 173 and the drain electrode 175 positioned on the interlayer insulating layer 160.

Slits 5166 and 5167 are provided in the buffer layer 120 and the interlayer insulating layer 160, and a slit 5168 is provided in the buffer layer 120 and gate insulating layer 140. The slits 5166, 5167, and 5168 do not overlap the semiconductor 135. The slits 5166, 5167, and 5168 expose the substrate 110.

The slits 5166 and 5167 overlap the drain electrode 175, while they do not overlap the gate electrode 154. The drain electrode 175 contacts the substrate 110 through the slits 5166 and 5167.

The slit 5168 overlaps the gate electrode 154. The gate electrode 154 contacts the substrate 110 through the slit 5168. The slit 5168 may have a bar shape in a plan view, and may extend in a direction substantially parallel to the driving voltage line 172. For example, the slit 5168 may substantially extend in a vertical direction. The slit 5168 is positioned at the right side of the semiconductor 135 in a plan view, and may be positioned to be adjacent to the right edges of the semiconductor 135. The gate electrode 154 is positioned in the slit 5168, and the gate electrode 154 may be made of an opaque metal material. Accordingly, light otherwise would be incident on a right surface of the semiconductor 135 may be blocked by the gate electrode 154 positioned in the slit 5168.

As such, the light incident on the lateral surface of the semiconductor 135 may be blocked by the drain electrode 175 and the gate electrode 154 positioned in the slits 5166, 5167, and 5168 and made of an opaque metal material. Further, an upper surface of the semiconductor 135 is mostly covered by the source electrode 173 and the drain electrode 175, and thus light otherwise would be incident on the upper surface of the semiconductor 135 may also be blocked. In the present exemplary embodiment, without adding a separate light blocking material layer, the light incident on the upper and lateral surfaces of the semiconductor 135 may be blocked by using the drain electrode 175, the gate electrode 154, the source electrode 173, etc.

Since a predetermined voltage is applied to the drain electrode 175 and the gate electrode 154, when different metal layers are exposed through the slits 5166, 5167, and 5168, they may be short-circuited with the drain electrode 175 and the gate electrode 154. Accordingly, in some embodiments, the different metal layers are not positioned below the slits 5166, 5167, and 5168.

Hereinafter, a light emitting diode display device according to an exemplary embodiment will be described with reference to FIG. 12.

Figure 12:
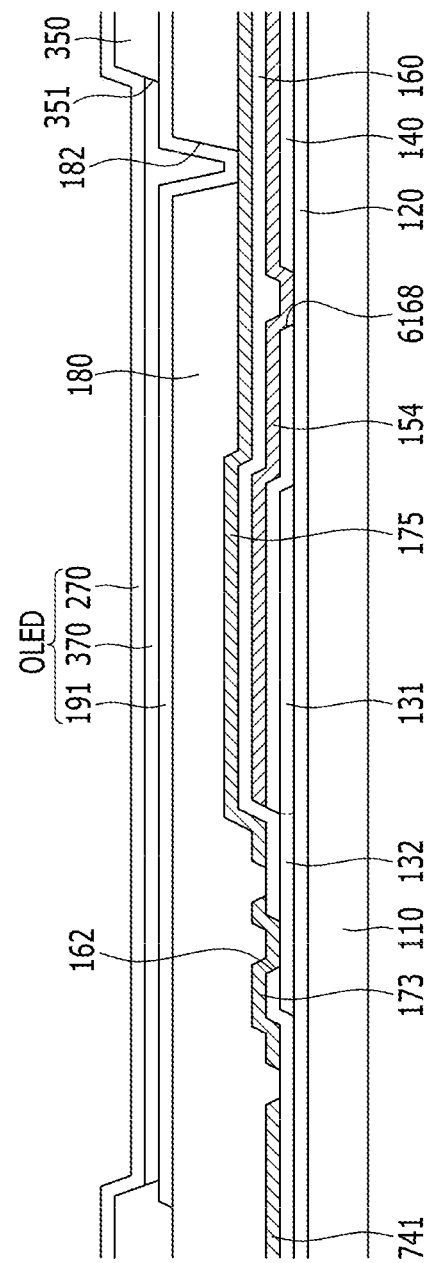
FIG. 12 illustrates a cross-sectional view of a light emitting diode display device according to an exemplary embodiment.

The light emitting diode display device according to the exemplary embodiment shown in FIG. 12 includes many portions that are the same as those in the light emitting diode display device according to the exemplary embodiment shown in FIG. 10 and FIG. 11, which will not be described. In the present exemplary embodiment, a configuration in which the drain electrode and the gate electrode do not contact the substrate is different from that of the previous exemplary embodiments, and will now be described in detail.

FIG. 12 illustrates a cross-sectional view of a light emitting diode display device according to an exemplary embodiment.

As shown in FIG. 12, a light emitting diode display device according to an exemplary embodiment includes the substrate 110, the semiconductor 135 positioned on the substrate 110, the gate insulating layer 140 positioned on the semiconductor 135, the gate electrode 154 positioned on the gate insulating layer 140, the interlayer insulating layer 160 positioned on the substrate 110 and the gate electrode 154, and the source electrode 173 and the drain electrode 175 positioned on the interlayer insulating layer 160.

A slit 6168 is provided in the gate insulating layer 140, and the slit 6168 does not overlap the semiconductor 135. The buffer layer 120 is further positioned between the substrate 110 and the semiconductor 135, and the slit 6168 exposes the buffer layer 120. Although the slit is provided in the buffer layer in the previous exemplary embodiment, the slit is not provided in the buffer layer in the present exemplary embodiment.

The slit 6168 overlaps the gate electrode 154. The gate electrode 154 contacts the buffer layer 120 through the slit 6168, while it may not contact the substrate 110.

Similarly, although not illustrated, the drain electrode 175 may also contact the buffer layer 120 through the slit, while it may not contact the substrate 110.

Hereinafter, a light emitting diode display device according to an exemplary embodiment will be described with reference to FIG. 13 and FIG. 14.

Figure 13:
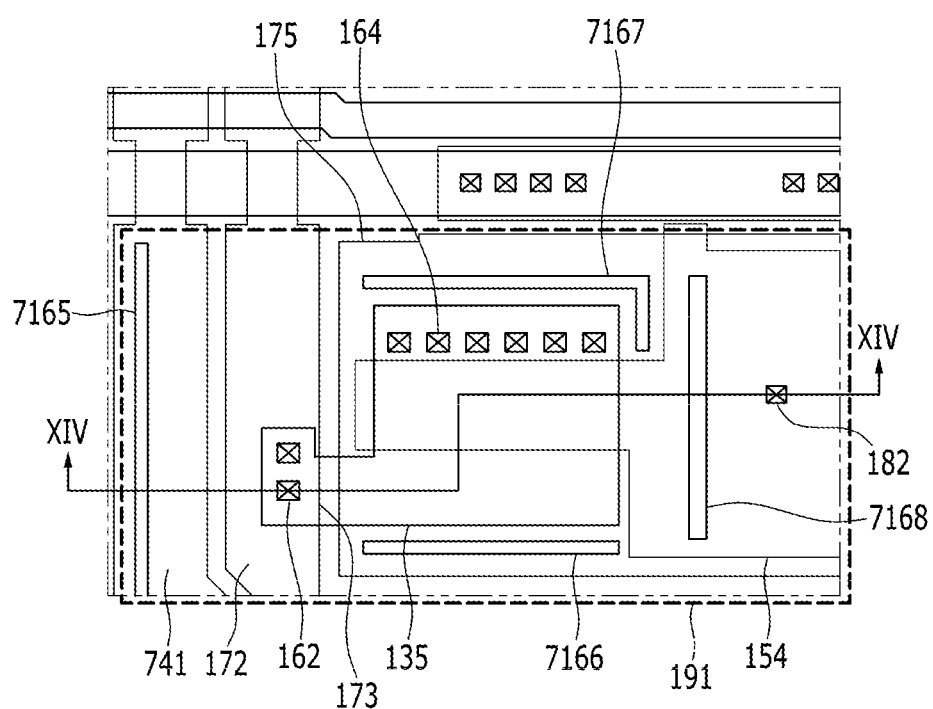
FIG. 13 illustrates a layout view of a light emitting diode display device according to an exemplary embodiment.
Figure 14:
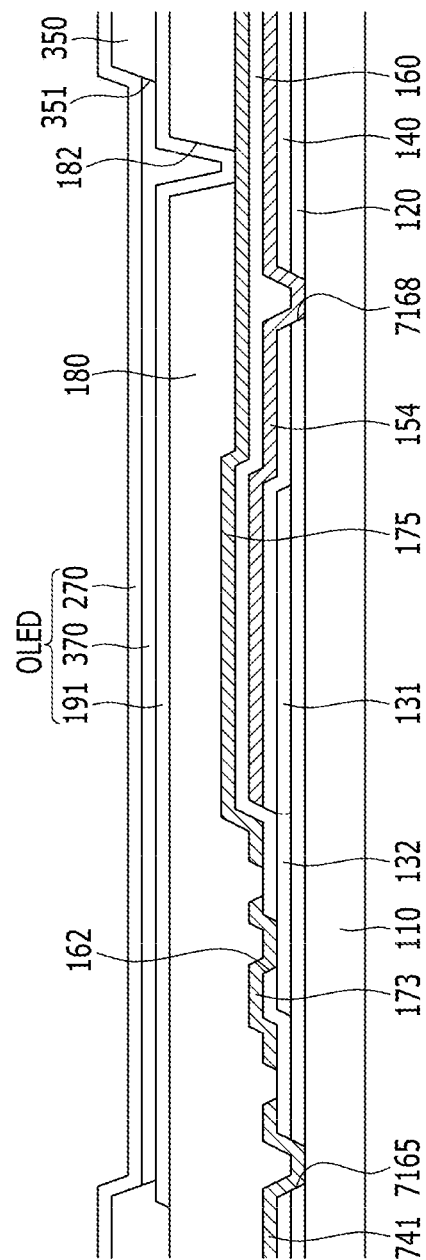
FIG. 14 illustrates a cross-sectional view taken along line XIV-XIV of FIG. 13.

The light emitting diode display device according to the exemplary embodiment shown in FIG. 13 and FIG. 14 includes many portions that are the same as those in the light emitting diode display device according to the exemplary embodiment shown in FIG. 10 and FIG. 11, which will not be described. In the present exemplary embodiment, a configuration in which the common voltage line contacts the substrate is different from that of the previous exemplary embodiments, and will now be described in detail.

FIG. 13 illustrates a layout view of a light emitting diode display device according to an exemplary embodiment, and FIG. 14 illustrates a cross-sectional view taken along line XIV-XIV of FIG. 13.

As shown in FIG. 13 and FIG. 14, a light emitting diode display device according to an exemplary embodiment includes the substrate 110, the semiconductor 135 positioned on the substrate 110, the gate insulating layer 140 positioned on the semiconductor 135, the gate electrode 154 positioned on the gate insulating layer 140, the interlayer insulating layer 160 positioned on the substrate 110 and the gate electrode 154, and the source electrode 173 and the drain electrode 175 positioned on the interlayer insulating layer 160.

Slits 7165, 7166, and 7167 are provided in the buffer layer 120 and the interlayer insulating layer 160, while a slit 7168 is provided in the buffer layer 120 and gate insulating layer 140. The slits 7165, 7166, 7167, and 7168 do not overlap the semiconductor 135. The slits 7165, 7166, 7167, and 7168 expose the substrate 110.

The slit 7165 overlaps the common voltage line 741. The common voltage line 741 contacts the substrate 110 through the slit 7165.

The slits 7166 and 7167 overlap the drain electrode 175. The drain electrode 175 contacts the substrate 110 through the slits 7166 and 7167.

The slit 7168 overlaps the gate electrode 154. The gate electrode 154 contacts the substrate 110 through the slit 7168.

As such, the light incident on the lateral surface of the semiconductor 135 may be blocked by the common voltage line 741, the drain electrode 175, and the gate electrode 154 positioned in the slits 7165, 7166, 7167, and 7168 and made of an opaque metal material. Further, the upper surface of the semiconductor 135 is mostly covered by the source electrode 173 and the drain electrode 175, and thus light incident otherwise would be on the upper surface of the semiconductor 135 may also be blocked. In the present exemplary embodiment, without adding a separate light blocking material layer, the light incident on the upper and lateral surfaces of the semiconductor 135 may be blocked by using the common voltage line 741, the drain electrode 175, the gate electrode 154, and the source electrode 173, etc.

Since a predetermined voltage is applied to the common voltage line 741, the drain electrode 175, and the gate electrode 154, when different metal layers are exposed through the slits 7165, 7166, 7167, and 7168, they may be short-circuited with the common voltage line 741, the drain electrode 175, and the gate electrode 154. Accordingly, in some embodiments, the different metal layers are not positioned below the slits 7165, 7166, 7167, and 7168.

Hereinafter, a light emitting diode display device according to an exemplary embodiment will be described with reference to FIG. 15.

Figure 15:
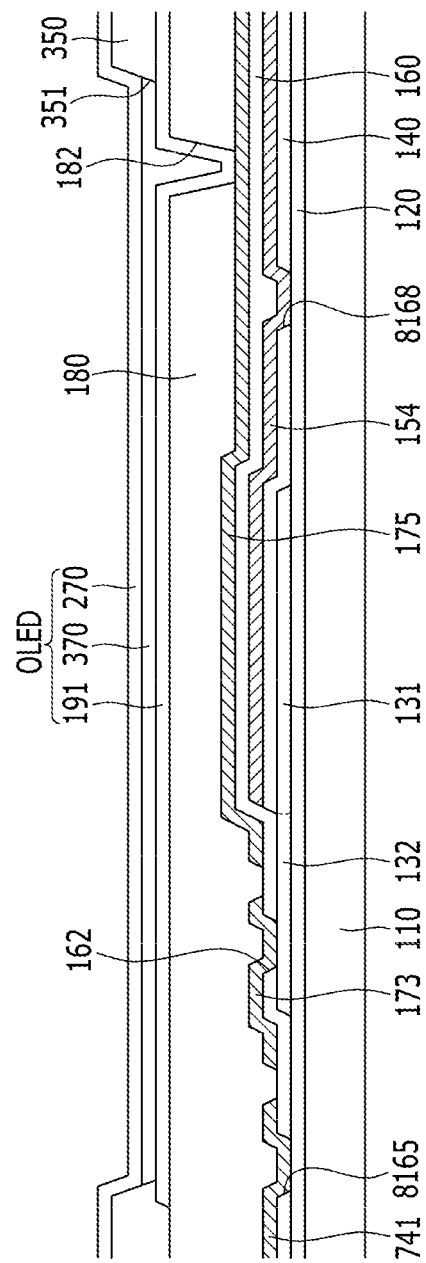
FIG. 15 illustrates a cross-sectional view of a light emitting diode display device according to an exemplary embodiment.

The light emitting diode display device according to the exemplary embodiment shown in FIG. 15 includes many portions that are the same as those in the light emitting diode display device according to the exemplary embodiment shown in FIG. 13 and FIG. 14, which will not be described. In the present exemplary embodiment, a configuration in which the common voltage line, the drain electrode, and the gate electrode do not contact the substrate is different from that of the previous exemplary embodiments, and will now be described in detail.

FIG. 15 illustrates a cross-sectional view of a light emitting diode display device according to an exemplary embodiment.

As shown in FIG. 15, a light emitting diode display device according to an exemplary embodiment includes the substrate 110, the semiconductor 135 positioned on the substrate 110, the gate insulating layer 140 positioned on the semiconductor 135, the gate electrode 154 positioned on the gate insulating layer 140, the interlayer insulating layer 160 positioned on the substrate 110 and the gate electrode 154, and the source electrode 173 and the drain electrode 175 positioned on the interlayer insulating layer 160.

A slit 8165 is provided in the interlayer insulating layer 160, and a slit 8168 is provided in the gate insulating layer 140. The slits 8165 and 8168 do not overlap the semiconductor 135. The buffer layer 120 is further positioned between the substrate 110 and the semiconductor 135, and the slits 8165 and 8168 expose the buffer layer 120. Although the slit is provided in the buffer layer in the previous exemplary embodiment, the slit is not provided in the buffer layer in the present exemplary embodiment.

The slit 8165 overlaps the common voltage line 741. The common voltage line 741 contacts the buffer layer 120 through the slit 8165, while it may not contact the substrate 110.

The slit 8168 overlaps the gate electrode 154. The gate electrode 154 contacts the buffer layer 120 through the slit 8168, while it may not contact the substrate 110.

Similarly, although not illustrated, the drain electrode 175 may also contact the buffer layer 120 through the slit, while it may not contact the substrate 110.

Hereinafter, a light emitting diode display device according to an exemplary embodiment will be described with reference to FIG. 16.

Figure 16:
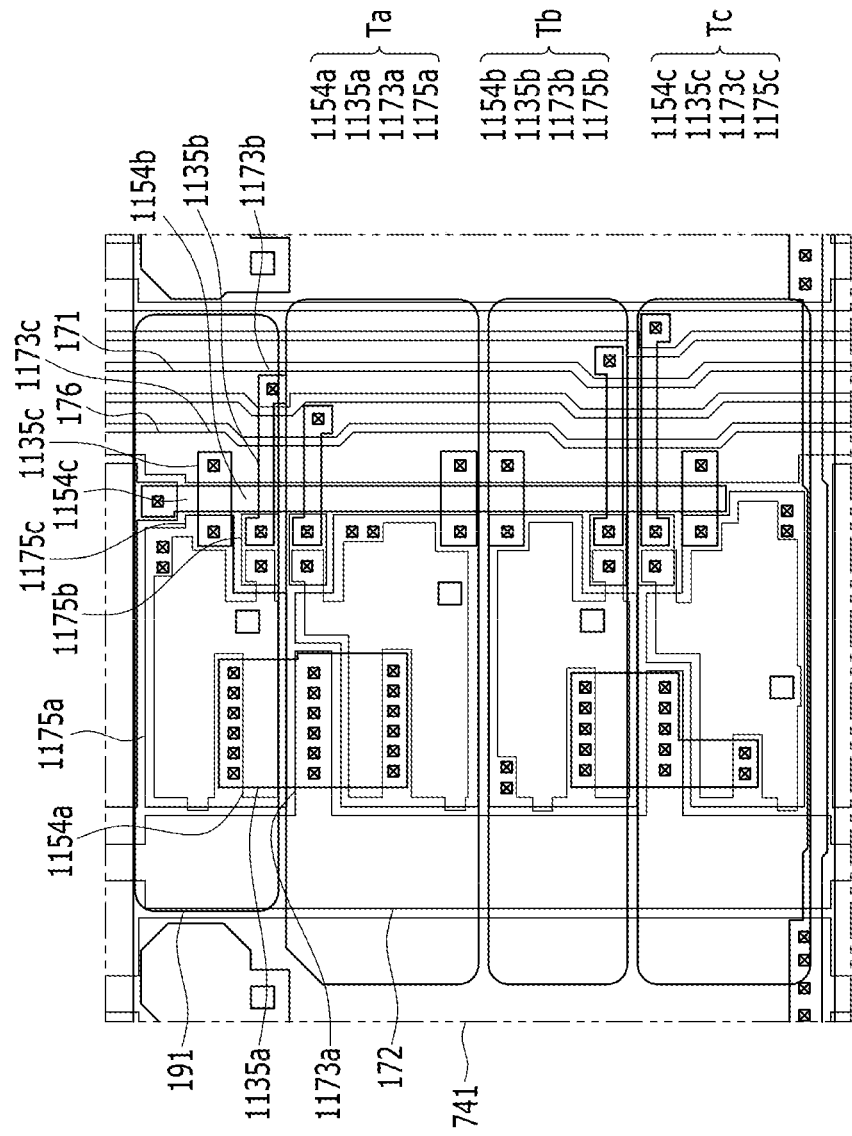
FIG. 16 illustrates a layout view of a light emitting diode display device according to an exemplary embodiment.

FIG. 16 illustrates a layout view of a light emitting diode display device according to an exemplary embodiment.

As shown in FIG. 16, a light emitting diode display device according to an exemplary embodiment includes a substrate (not shown), and a first thin film transistor (Ta), a second thin film transistor (Tb), a third thin film transistor (Tc), and a first electrode 191 that are positioned on the substrate. In addition, the light emitting diode display device according to the exemplary embodiment may further include the common voltage line 741, the driving voltage line 172, a data line 171, and a sensing line 176.

The first thin film transistor (Ta) includes a first gate electrode 1154a, a first semiconductor 1135a, a first source electrode 1173a, and a first drain electrode 1175a. The first source electrode 1173a is connected to the driving voltage line 172. The first semiconductor 1135a overlaps the first gate electrode 1154a. Some region of the first semiconductor 1135a is connected to the first source electrode 1173a, and some other region of the first semiconductor 1135a is connected to the first drain electrode 1175a. The first thin film transistor (Ta) may be a driving thin film transistor.

The second thin film transistor (Tb) includes a second gate electrode 1154b, a second semiconductor 1135b, a second source electrode 1173b, and a second drain electrode 1175b. The second source electrode 1173b is connected to the data line 171. The second semiconductor 1135b overlaps the second gate electrode 1154b. Some region of the second semiconductor 1135b is connected to the second source electrode 1173b, and some other region of the second semiconductor 1135b is connected to the second drain electrode 1175b. The second drain electrode 1175b is connected to the first gate electrode 1154a. The second thin film transistor (Tb) may be a switching thin film transistor.

The third thin film transistor (Tc) includes a third gate electrode 1154c, a third semiconductor 1135c, a third source electrode 1173c, and a third drain electrode 1175c. The third source electrode 1173c is connected to the sensing line 176. The third semiconductor 1135c overlaps the third gate electrode 1154c. Some region of the third semiconductor 1135c is connected to the third source electrode 1173c, and some other region of the third semiconductor 1135c is connected to the third drain electrode 1175c. The third drain electrode 1175c is connected to the first drain electrode 1175a. The third thin film transistor (Tc) may be a sensing switching thin film transistor.

The first electrode 191 is formed to have a substantially quadrangular shape, and overlaps the first thin film transistor (Ta), the second thin film transistor (Tb), and the third thin film transistor (Tc). Particularly, the first electrode 191 overlaps most regions of the first semiconductor 1135a, the second semiconductor 1135b, and the third semiconductor 1135c. The first electrode 191 may include a reflective metal material. Accordingly, since the first electrode 191 covers most regions of the first semiconductor 1135a, the second semiconductor 1135b, and the third semiconductor 1135c, light incident on upper surfaces of the first semiconductor 1135a, the second semiconductor 1135b, and the third semiconductor 1135c may be blocked.

Hereinafter, a light emitting diode display device according to an exemplary embodiment will be described with reference to FIG. 17.

Figure 17:
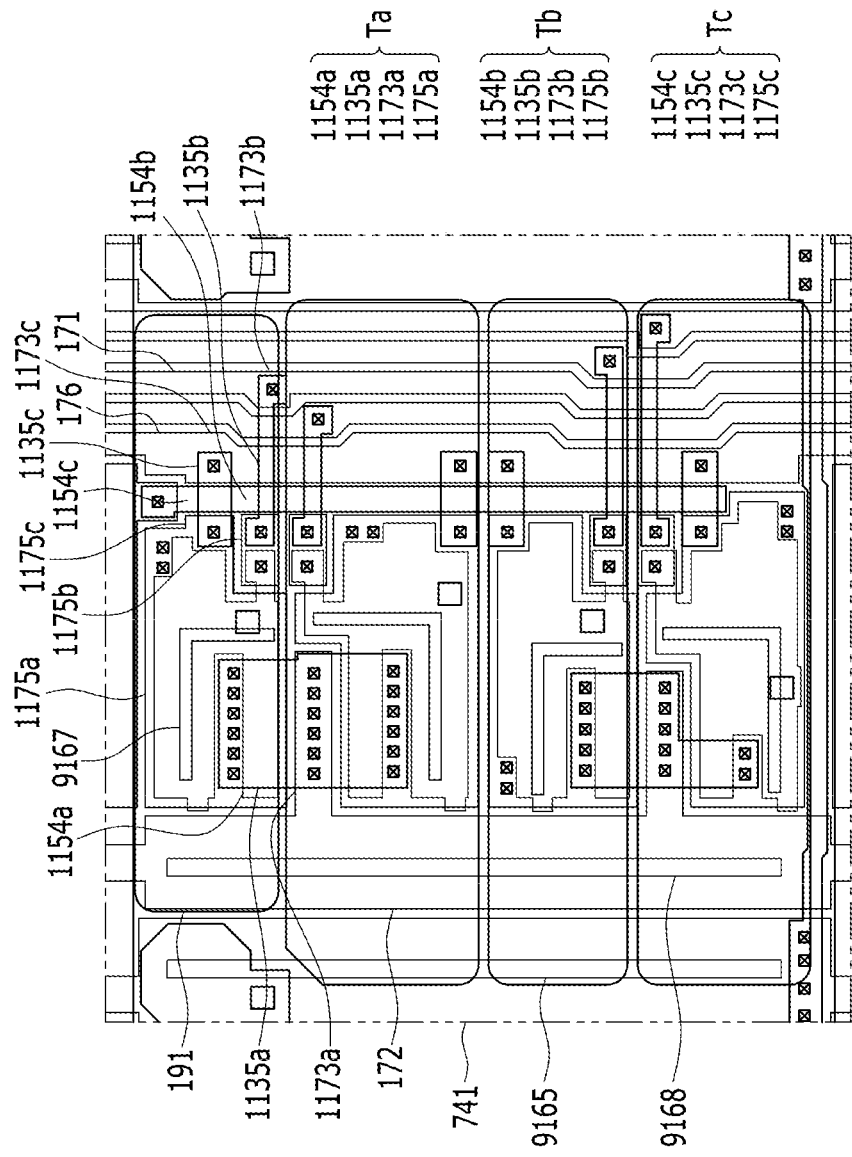
FIG. 17 illustrates a layout view of a light emitting diode display device according to an exemplary embodiment.

The light emitting diode display device according to the exemplary embodiment shown in FIG. 17 includes many portions that are the same as those in the light emitting diode display device according to the exemplary embodiment shown in FIG. 16, which will not be described. In the present exemplary embodiment, a configuration in which slits overlapping the common voltage line, the driving voltage line, and the first gate electrode are further formed is different from that of the previous exemplary embodiments, and will now be described in detail.

FIG. 17 illustrates a layout view of a light emitting diode display device according to an exemplary embodiment.

As shown in FIG. 17, a light emitting diode display device according to an exemplary embodiment includes a substrate (not shown), and a first thin film transistor (Ta), a second thin film transistor (Tb), a third thin film transistor (Tc), and a first electrode 191 that are positioned on the substrate. In addition, the light emitting diode display device according to the exemplary embodiment may further include the common voltage line 741, the driving voltage line 172, the data line 171, and the sensing line 176.

The interlayer insulating layer (not shown) may be positioned between the substrate and the common voltage line 741 and between the substrate and the driving voltage line 172. Slits 9165 and 9168 are provided in the interlayer insulating layer. The gate insulating layer (not shown) may be positioned between the substrate and the first gate electrode 1154a. A slit 9167 is provided in the gate insulating layer.

The slit 9165 overlaps the common voltage line 741. The common voltage line 741 contacts the substrate through the slit 9165.

The slit 9168 overlaps the driving voltage line 172. The driving voltage line 172 contacts the substrate through the slit 9168.

The slit 9167 overlaps the first gate electrode 1154a. The first gate electrode 1154a contacts the substrate through the slit 9167.

As in another exemplary embodiment previously described, the buffer layer may be further positioned below the interlayer insulating layer and the gate insulating layer. The slits 9165, 9167, and 9168 may be provided in the buffer layer. Alternatively, the slits 9165, 9167, and 9168 may not be provided in the buffer layer, while they may be provided only in the interlayer insulating layer and the gate insulating layer. In this case, the common voltage line 741, the driving voltage line 172, and the first gate electrode 1154a do not contact the substrate, while they contact the buffer layer.

Hereinafter, a light emitting diode display device according to an exemplary embodiment will be described with reference to FIG. 18 to FIG. 21.

Figure 18:
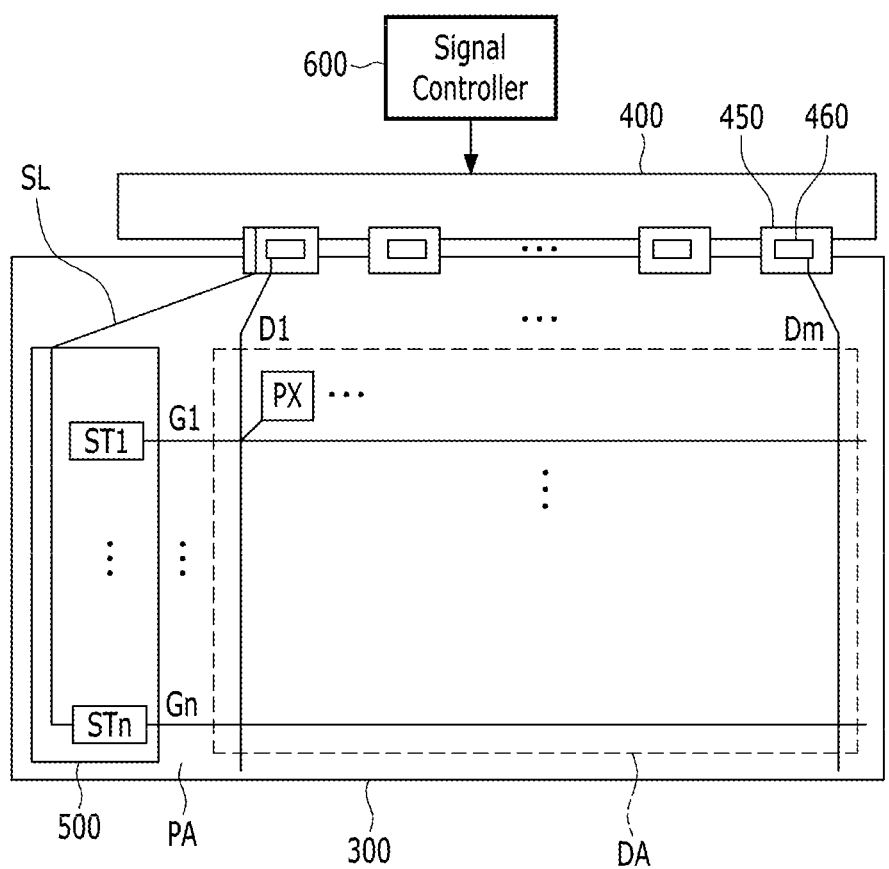
FIG. 18 illustrates a schematic view of a light emitting diode display device according to an exemplary embodiment.
Figure 19:
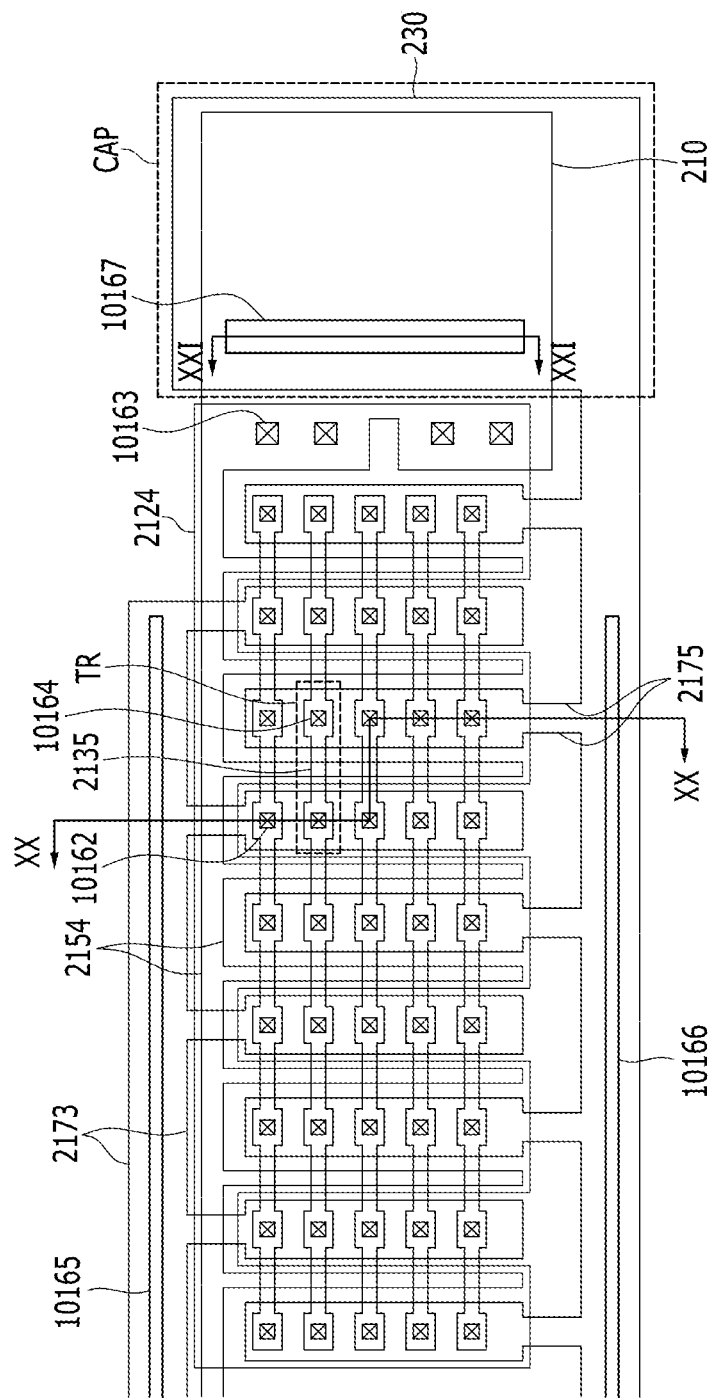
FIG. 19 illustrates a layout view of a thin film transistor included in a gate driver of a light emitting diode display device according to an exemplary embodiment.
Figure 20:
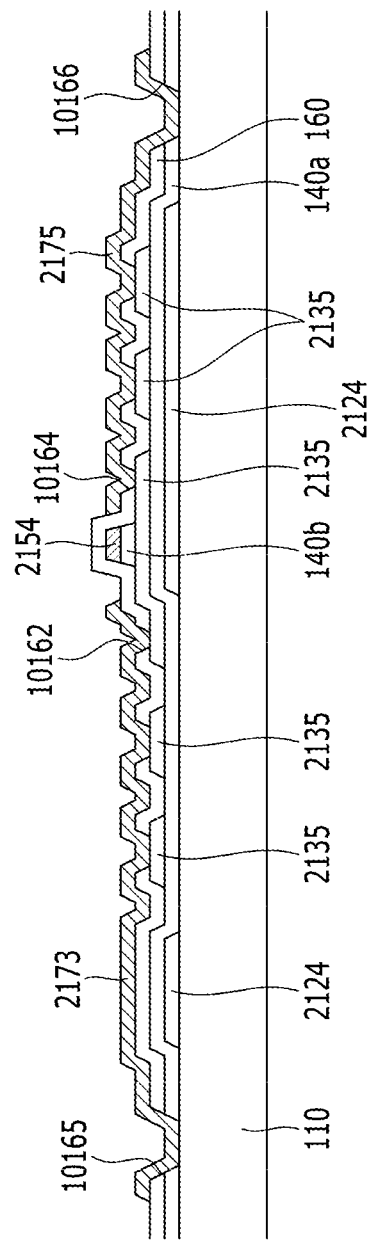
FIG. 20 illustrates a cross-sectional view taken along line XX-XX of FIG. 19.
Figure 21:
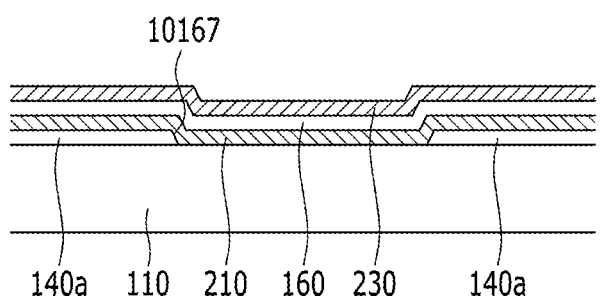
FIG. 21 illustrates a cross-sectional view taken along line XXI-XXI of FIG. 19.

FIG. 18 illustrates a schematic view of a light emitting diode display device according to an exemplary embodiment, FIG. 19 illustrates a layout view of a thin film transistor included in a gate driver of a light emitting diode display device according to an exemplary embodiment, FIG. 20 illustrates a cross-sectional view taken along line XX-XX of FIG. 19, and FIG. 21 illustrates a cross-sectional view taken along line XXI-XXI of FIG. 19.

As shown in FIG. 18, a light emitting diode display device according to an exemplary embodiment includes a display panel 300, a data driver 460, a gate driver 500, a signal controller 600, etc.

The display panel 300 includes a display area (DA) displaying an image, and a peripheral area (PA) surrounding the display area (DA). The gate driver 500 for applying gate voltages to gate lines (G1 to Gn) is disposed in the peripheral area (PA).

Data lines (D1 to Dm) of the display area (DA) may receive data voltages from the data driver 460. In this case, the data driver 460 may be an integrated circuit (IC) disposed on a flexible printed circuit board (FPCB) 450 attached to the display panel 300.

The gate driver 500 and the data driver 460 are controlled by the signal controller 600. A printed circuit board (PCB) 400 is positioned at the outside of the flexible printed circuit board 450 and configured to transmit a signal from the signal controller 600 to the data driver 460 and the gate driver 500.

The signal transmitted to the gate driver 500 from the signal controller 600 through a plurality of signal lines SL may include a signal such as a vertical start signal, a clock signal, and a low voltage signal of a predetermined level.

A plurality of pixels PX may be disposed in the display area (DA), and the plurality of gate lines (G1 to Gn) and the plurality of data lines (D1 to Dm) may cross while being insulated from each other.

The data lines (D1 to Dm) receive the data voltages from the data driver 460, and the gate lines (G1 to Gn) receive gate voltages from the gate driver 500.

The data driver 460 may be positioned on an upper or lower side of the display panel 300 and connected to the data lines (D1 to Dm) extending in a vertical direction.

The gate driver 500 receives a vertical start signal, a clock signal, and a low voltage corresponding to a gate-off voltage, and generates gate voltages (a gate-on voltage and a gate-off voltage) and applies them to the gate lines (G1 to Gn).

The gate driver 500 may include a plurality of stages for generating and outputting gate voltages through the signals, and each stage may include a plurality of thin film transistors. The gate driver 500 may be integrated in the peripheral area (PA) of the display panel 300.

As shown in FIG. 19 to FIG. 21, a gate driver of a light emitting diode display device according to an exemplary embodiment may include the thin film transistor (TR) and a capacitor (CAP).

A plurality of thin film transistors (TR) may be disposed in one gate driver. The plurality of thin film transistors (TR) may be disposed in a matrix form.

The capacitor (CAP) may be disposed at end portions of the plurality of thin film transistors (TR). In the present exemplary embodiment, the capacitor (CAP) is disposed at right end portions of the plurality of thin film transistors (TR). Although not illustrated, the display area (DA) of the display panel 300 may be disposed at a right side of the capacitor (CAP). That is, the capacitor (CAP) may be disposed between the plurality of thin film transistors (TR) and the display area (DA). However, a position of the capacitor (CAP) is not limited thereto, and the capacitor (CAP) may be disposed at left end portions of the plurality of thin film transistors (TR). Thus, the plurality of thin film transistors (TR) may be disposed between the capacitor (CAP) and the display area (DA).

The thin film transistor (TR) includes a lower gate electrode 2124, a semiconductor 2135, an upper gate electrode 2154, a source electrode 2173, and a drain electrode 2175.

The lower gate electrode 2124 is positioned on the substrate 110. The lower gate electrode 2124 may overlap some of the semiconductor 2135. The lower gate electrode 2124 may block light that passes through the substrate 110 from being incident on the semiconductor 2135.

A first insulating layer 140a may be positioned the lower gate electrode 2124. The first insulating layer 140a may include an inorganic insulating material or organic insulating material such as a silicon oxide (SiOx), a silicon nitride (SiNx), silicon oxynitride (SiON), silicon oxyfluoride (SiOF), an aluminum oxide (AlOx), etc., and it may be formed as a single layer or a multilayer including at least one of the materials.

The semiconductor 2135 is positioned on the first insulating layer 140a. The semiconductor 2135 may overlap some of the lower gate electrode 2124 in a direction perpendicular to the substrate 110. The semiconductor 2135 may be made of an oxide semiconductor material. For example, the semiconductor 2135 may be an indium-gallium-zinc oxide (IGZO) or an indium-tin-zinc oxide (ITZO).

A second insulating layer 140b may be positioned the semiconductor 2135. The second insulating layer 140b may include an inorganic insulating material or organic insulating material such as a silicon oxide (SiOx), a silicon nitride (SiNx), silicon oxynitride (SiON), silicon oxyfluoride (SiOF), an aluminum oxide (AlOx), etc., and it may be formed as a single layer or a multilayer including at least one of the materials.

The upper gate electrode 2154 is positioned on the second insulating layer 140b. The upper gate electrode 2154 overlaps the semiconductor 2135 with the second insulating layer 140b therebetween. The upper gate electrode 2154 may be electrically connected to the lower gate electrode 2124. A slit 10163 may be provided in the first insulating layer 140a. The upper gate electrode 2154 may be connected to the lower gate electrode 2124 through the slit 10163 to have a dual gate structure.

An interlayer insulating layer 160 is positioned on the upper gate electrode 2154. The interlayer insulating layer 160 may include an inorganic insulating material or organic insulating material such as a silicon oxide (SiOx), a silicon nitride (SiNx), silicon oxynitride (SiON), silicon oxyfluoride (SiOF), an aluminum oxide (AlOx), etc., and it may be formed as a single layer or a multilayer including at least one of the materials.

The source electrode 2173 and the drain electrode 2175 are positioned on the interlayer insulating layer 160. The source electrode 2173 may include a first portion that extends in a substantially horizontal direction, and a second portion that protrudes from the first portion and extends in a substantially vertical direction to overlap the semiconductor 2135. The drain electrode 2175 may include a first portion that extends in a substantially horizontal direction, and a second portion that protrudes from the first portion and extends in a substantially vertical direction to overlap the semiconductor 2135. The source electrode 2173 protrudes toward the drain electrode 2175, and the drain electrode 2175 protrudes toward the source electrode 2173.

Slits 10162 and 10164 are provided in the interlayer insulating layer 160. The slit 10162 overlaps the source electrode 2173 and the semiconductor 2135. The source electrode 2173 is connected to the semiconductor 2135 through the slit 10162. The slit 10164 overlaps the drain electrode 2175 and the semiconductor 2135. The drain electrode 2175 is connected to the semiconductor 2135 through the slit 10164.

Slits 10165 and 10166 are further provided in the first insulating layer 140a and the interlayer insulating layer 160. The slits 10165 and 10166 do not overlap the semiconductor 2135, the lower gate electrode 2124, and the upper gate electrode 2154. The slits 10165 and 10166 expose the substrate 110.

The slit 10165 overlaps the source electrode 2173. The source electrode 2173 contacts the substrate 110 through the slit 10165. The slit 10165 may have a bar shape in a plan view, and may extend in a direction substantially parallel to the source electrode 2173. For example, the slit 10165 may substantially extend in a horizontal direction. The slit 10165 is positioned at an upper side of an uppermost semiconductor 2135 in a plan view, and may be positioned to be adjacent to an upper edge of the uppermost semiconductor 2135. The source electrode 2173 is positioned in the slit 10165, and the source electrode 2173 may be made of an opaque metal material. Accordingly, light otherwise would be incident on an upper surface of the semiconductor 2135 may be blocked by the source electrode 2173 positioned in the slit 10165.

The slit 10166 overlaps the drain electrode 2175. The drain electrode 2175 contacts the substrate 110 through the slit 10166. The slit 10166 may have a bar shape in a plan view, and may extend in a direction substantially parallel to the drain electrode 2175. For example, the slit 10166 may substantially extend in a horizontal direction. The slit 10166 is positioned at a lower side of a lowermost semiconductor 2135 in a plan view, and may be positioned to be adjacent to a lower edge of the lower side of a lowermost semiconductor 2135. The drain electrode 2175 is positioned in the slit 10166, and the drain electrode 2175 may be made of an opaque metal material. Accordingly, light otherwise would be incident on a lower surface of the semiconductor 2135 may be blocked by the drain electrode 2175 positioned in the slit 10166.

The capacitor (CAP) includes a first capacitor electrode 210, the interlayer insulating layer 160, and a second capacitor electrode 230.

The first capacitor electrode 210 is positioned on the first insulating layer 140a, and is electrically connected to the upper gate electrode 2154. The first capacitor electrode 210 may be positioned at the same layer as the upper gate electrode 2154, and may be made of the same material as that the upper gate electrode 2154.

The second capacitor electrode 230 is positioned to overlap the first capacitor electrode 210. The interlayer insulating layer 160 is positioned between the first capacitor electrode 210 and the second capacitor electrode 230. The interlayer insulating layer 160 may serve as a dielectric material. The second capacitor electrode 230 is electrically connected to the drain electrode 2175. The second capacitor electrode 230 may be positioned at the same layer as the source electrode 2173 and the drain electrode 2175, and may be made of the same material as that of the source electrode 2173 and the drain electrode 2175.

A slit 10167 is further provided in the first insulating layer 140a. The slit 10167 does not overlap the semiconductor 2135. The slit 10167 exposes the substrate 110.

The slit 10167 overlaps the first capacitor electrode 210. The first capacitor electrode 210 contacts the substrate 110 through the slit 10167. The slit 10167 may have a bar shape in a plan view, and may substantially extend in a vertical direction. The slit 10167 is positioned at right sides of semiconductors 2135 in a plan view, and may be positioned to be adjacent to right edges of the semiconductors 2135. The first capacitor electrode 210 is positioned in the slit 10167, and the first capacitor electrode 210 may be made of an opaque metal material. Accordingly, light otherwise would be incident on a lateral surface of the semiconductor 2135 may be blocked by the first capacitor electrode 210 positioned in the slit 10167.

As such, light otherwise would be incident on a lateral surface of the semiconductor 2135 may be blocked by the source electrode 2173, the drain electrode 2175, and the first capacitor electrode 210 that are positioned in the slits 10165, 10166, and 10167 and made of an opaque metal material. Further, since the upper surface of the semiconductor 2135 is mostly covered by the source electrode 2173, the drain electrode 2175, and the upper gate electrode 2154, light otherwise would be incident on the upper surface of the semiconductor 2135 may also be blocked. In the present exemplary embodiment, without adding a separate light blocking material layer, light otherwise would be incident on the upper and lateral surfaces of the semiconductor 2135 may be blocked by using the source electrode 2173, the drain electrode 2175, the first capacitor electrode 210, etc.

Since a predetermined voltage is applied to the source electrode 2173, the drain electrode 2175, and the first capacitor electrode 210, when different metal layers are exposed through the slits 10165, 10166, and 10167, they may be short-circuited with the source electrode 2173, the drain electrode 2175, and the first capacitor electrode 210. Accordingly, in some embodiments, the different metal layers are not positioned below the slits 10165, 10166, and 10167.

As in another exemplary embodiment previously described, the buffer layer may be further positioned below the interlayer insulating layer 160 and the first insulating layer 140a. The slits 10165, 10166, and 10167 may be provided in the buffer layer. Alternatively, the slits 10165, 10166, and 10167 may not be provided in the buffer layer, while they may be provided only in the interlayer insulating layer 160 and the first insulating layer 140a. In this case, the source electrode 2173, the drain electrode 2175, and the first capacitor electrode 210 do not contact the substrate 110, while they contact the buffer layer.

While this disclosure has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light emitting diode display device, comprising:
   an insulating substrate;
   a semiconductor disposed on the substrate;
   a gate electrode disposed on the semiconductor;
   an interlayer insulating layer disposed on the substrate and the gate electrode;
   source and drain electrodes disposed on the interlayer insulating layer and connected to the semiconductor;
   a first slit provided in the interlayer insulating layer;
   a first wire disposed on the interlayer insulating layer and configured to overlap the first slit; and
   a light emitting diode on the first wire and the interlayer insulating layer,
   wherein the first wire is disposed between the substrate and the light emitting diode, and
   wherein the first wire is disposed at the same layer as the source electrode and the drain electrode, and is made of the same material as that of the source electrode and the drain electrode.

2. The light emitting diode display device of claim 1, wherein
   the first wire contacts the substrate through the first slit.

3. The light emitting diode display device of claim 2, wherein
   the first wire is a common voltage line.

4. The light emitting diode display device of claim 2, wherein
   the first wire is a driving voltage line connected to the source electrode.

5. The light emitting diode display device of claim 1, wherein
   the first slit is adjacent to an edge of one side of the semiconductor, and does not overlap the semiconductor.

6. The light emitting diode display device of claim 5, wherein
   the first slit has a bar shape extending in a first direction.

7. The light emitting diode display device of claim 6, wherein
   the first slit extends in a direction parallel to the first wire.

8. The light emitting diode display device of claim 1, wherein
   the first slit has a bar shape extending in a direction parallel to the first wire.

9. The light emitting diode display device of claim 1, wherein
   the drain electrode has an island shape.

10. The light emitting diode display device of claim 1, wherein
    the semiconductor includes a channel region and a contact doping region positioned at opposite sides of the channel region, and
    the channel region is covered by the drain electrode.

11. The light emitting diode display device of claim 1, further comprising
    a second slit provided in the interlayer insulating layer,
    wherein the drain electrode overlaps the second slit.

12. The light emitting diode display device of claim 11, wherein
    the drain electrode contacts the substrate through the second slit.

13. The light emitting diode display device of claim 11, wherein
    the second slit is adjacent to an edge of one side of the semiconductor, and does not overlap the semiconductor.

14. The light emitting diode display device of claim 13, wherein
    the second slit extends in a direction crossing a direction in which the first wire extends.

15. The light emitting diode display device of claim 1, further comprising:
    a first electrode connected to the drain electrode; and
    a passivation layer disposed between the drain electrode and the first electrode, wherein the passivation layer is made of a light blocking material.

16. The light emitting diode display device of claim 15, further comprising
a pixel defining layer configured to overlap an edge of the first electrode,
wherein the pixel defining layer is made of a light blocking material.

17. The light emitting diode display device of claim 1, further comprising:
a first electrode connected to the drain electrode; and
a pixel defining layer configured to overlap an edge of the first electrode,
wherein the pixel defining layer is made of a light blocking material.

18. The light emitting diode display device of claim 1, further comprising
a buffer layer disposed between the substrate and the interlayer insulating layer,
wherein the first slit is provided in the buffer layer and the interlayer insulating layer.

19. The light emitting diode display device of claim 1, further comprising
a buffer layer disposed between the substrate and the interlayer insulating layer,
wherein the first wire contacts the buffer layer through the first slit.

20. The light emitting diode display device of claim 1, further comprising:
a third slit provided in the interlayer insulating layer; and
a second wire positioned on the interlayer insulating layer, and configured to overlap the third slit.

21. The light emitting diode display device of claim 20, wherein
the second wire is connected to the substrate through the third slit.

22. The light emitting diode display device of claim 20, further comprising
a buffer layer disposed between the substrate and the interlayer insulating layer,
wherein the second wire contacts the buffer layer through the third slit.

23. The light emitting diode display device of claim 1, further comprising:
a gate insulating layer disposed between the substrate and the gate electrode; and
a fourth slit provided in the gate insulating layer,
wherein the gate electrode overlaps the fourth slit.

24. The light emitting diode display device of claim 23, wherein
the gate electrode is connected to the substrate through the fourth slit.

25. The light emitting diode display device of claim 23, further comprising
a buffer layer disposed between the substrate and the gate insulating layer,
wherein the gate electrode contacts the buffer layer through the fourth slit.

26. The light emitting diode display device of claim 1, further comprising
a first electrode connected to the drain electrode,
wherein the first electrode covers most of the semiconductor.

27. The light emitting diode display device of claim 26, wherein
the first electrode covers all of the semiconductor, the source electrode, the drain electrode, the gate electrode, and the first wire.

28. A light emitting diode display device, comprising:
a substrate;
a semiconductor disposed on the substrate;
source and drain electrodes connected to the semiconductor;
a gate electrode disposed on the semiconductor;
a gate insulating layer disposed between the substrate and the gate electrode; and
a first slit provided in the gate insulating layer, and configured to overlap the gate electrode,
wherein the gate electrode contacts the substrate through the first slit.

29. The light emitting diode display device of claim 28, wherein
the first slit is adjacent to an edge of one side of the semiconductor, and does not overlap the semiconductor.

30. The light emitting diode display device of claim 28, wherein
the first slit has a bar shape extending in a first direction.

31. The light emitting diode display device of claim 28, further comprising:
an interlayer insulating layer disposed between the substrate and the drain electrode; and
a second slit provided in the interlayer insulating layer,
wherein the drain electrode overlaps the second slit.

32. The light emitting diode display device of claim 31, wherein
the drain electrode contacts the substrate through the second slit.

33. The light emitting diode display device of claim 31, wherein
the second slit is adjacent to an edge of one side of the semiconductor, and does not overlap the semiconductor.

34. The light emitting diode display device of claim 33, wherein
the second slit has a bar shape extending in a direction crossing the direction in which the first slit extends.

35. The light emitting diode display device of claim 28, further comprising
a buffer layer disposed between the substrate and the gate insulating layer,
wherein the gate electrode contacts the buffer layer through the first slit.

* * * * *